(12) United States Patent
Kanematsu et al.

(10) Patent No.: US 11,233,164 B2
(45) Date of Patent: Jan. 25, 2022

(54) SOLAR CELL, AND METHOD FOR MANUFACTURING SOLAR CELL

(71) Applicant: PANASONIC CORPORATION, Osaka (JP)

(72) Inventors: Daiji Kanematsu, Osaka (JP); Keiichiro Masuko, Osaka (JP); Izuru Nakai, Osaka (JP); Hirotaka Katayama, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/959,789

(22) PCT Filed: Jan. 9, 2019

(86) PCT No.: PCT/JP2019/000285
§ 371 (c)(1),
(2) Date: Aug. 21, 2020

(87) PCT Pub. No.: WO2019/139020
PCT Pub. Date: Jul. 18, 2019

(65) Prior Publication Data
US 2021/0159355 A1 May 27, 2021

(30) Foreign Application Priority Data
Jan. 10, 2018 (JP) .............................. JP2018-001923

(51) Int. Cl.
*H01L 31/00* (2006.01)
*H01L 31/068* (2012.01)
(Continued)

(52) U.S. Cl.
CPC .. *H01L 31/0682* (2013.01); *H01L 31/022466* (2013.01); *H01L 31/0445* (2014.12); *H01L 31/05* (2013.01); *H01L 31/0747* (2013.01)

(58) Field of Classification Search
CPC ............. H01L 31/0682; H01L 31/0445; H01L 31/022466; H01L 31/05; H01L 31/0747; H01L 21/76; H01L 31/0224; Y02E 10/547
See application file for complete search history.

(56) References Cited

U.S. PATENT DOCUMENTS

2018/0033898 A1    2/2018  Shigematsu et al.

FOREIGN PATENT DOCUMENTS

JP      2006261447 A  *  9/2006
WO      2016/157701 A1    10/2016

OTHER PUBLICATIONS

English machine translation of JP-2006261447-A (Year: 2005).*
(Continued)

*Primary Examiner* — Angelo Trivisonno
(74) *Attorney, Agent, or Firm* — McDermott Will and Emery LLP

(57) ABSTRACT

A solar cell (1) includes a semiconductor substrate (10) having a light-receiving surface (10a) and a back surface (10b); an n-type semiconductor layer (13n) and a p-type semiconductor layer (12p) provided on the back surface (10b) of the semiconductor substrate (10), the n-type semiconductor layer (13n) and the p-type semiconductor layer (12p) extending in a first direction and being adjacent to each other in a second direction intersecting with the first direction; and a ground layer (14) provided on the n-type semiconductor layer (13n) and the p-type semiconductor layer (12p). The ground layer (14) includes an n-side ground layer (14n) and a p-side ground layer (14p) separated from each other by a first separating groove (17) having a first separating portion (17a) and a second separating portion (17b) as well as a first bridge portion (18) separating the first separating portion (17a) and the second separating portion (17b). The first bridge portion (18) separates the first sepa- (Continued)

rating portion (17*a*) and the second separating portion (17*b*) at at least one of a border on the n-side ground layer (14*n*) or a border on the p-side ground layer (14*p*) in the first direction.

10 Claims, 16 Drawing Sheets

(51) Int. Cl.
*H01L 31/0445* (2014.01)
*H01L 31/0224* (2006.01)
*H01L 31/05* (2014.01)
*H01L 31/0747* (2012.01)

(56) References Cited

OTHER PUBLICATIONS

International Search Report and Written Opinion dated Apr. 2, 2019 in International Patent Application No. PCT/JP2019/000285; with partial English translation.

\* cited by examiner

SOLAR CELL, AND METHOD FOR MANUFACTURING SOLAR CELL

CROSS-REFERENCE OF RELATED APPLICATIONS

This application is the U.S. National Phase under 35 U.S.C. § 371 of International Patent Application No. PCT/JP2019/000285, filed on Jan. 9, 2019, which in turn claims the benefit of Japanese Application No. 2018-001923, filed on Jan. 10, 2018, the entire disclosures of which Applications are incorporated by reference herein.

TECHNICAL FIELD

The present invention relates to a back-junction solar cell and a method for manufacturing the back-junction solar cell.

BACKGROUND ART

As a solar cell with improved photoelectric conversion efficiency, a back-junction solar cell is being studied in which both an n-type semiconductor layer and a p-type semiconductor layer are formed on a semiconductor substrate's back surface that is opposite to its light-receiving surface that receives light. In a back-junction solar cell, a transparent electrode layer (a ground layer), a seed layer (a conductive layer), and a plating layer (an n-side electrode and a p-side electrode) for extracting generated electric power are laminated on the back surface.

Patent Literature 1 discloses a solar cell in which an n-side electrode and a p-side electrode are completely separated from each other by a separating region (a separating groove) provided in a transparent electrode layer.

CITATION LIST

Patent Literature

PTL 1: International Patent Publication No. 2016/157701

SUMMARY OF THE INVENTION

Technical Problem

In one method for forming a separating groove in a ground layer, laser machining is employed. In a case where a ground layer is completely separated by a separating groove, as in the case described above, there arises a portion where scanning paths intersect in laser patterning. If a workpiece continues to be irradiated with a laser while the laser scans through the intersecting scanning paths, this produces a portion that is irradiated with the laser excessively. Thus, a semiconductor layer and a semiconductor substrate may be damaged, which may result in a decrease in the photoelectric conversion efficiency.

Accordingly, the present invention is directed to providing a solar cell with less damage on a semiconductor layer and so on and a method for manufacturing such a solar cell when laser machining is employed.

Solutions to Problem

To achieve the above, a solar cell according to one aspect of the present invention is a back-junction solar cell, and the back-junction solar cell includes: a semiconductor substrate having a light-receiving surface on which light is incident and a back surface that is opposite to the light-receiving surface; an n-type semiconductor layer and a p-type semiconductor layer provided on the back surface of the semiconductor substrate, the n-type semiconductor layer and the p-type semiconductor layer extending in a first direction and being adjacent to each other in a second direction intersecting with the first direction; and a ground layer provided on the n-type semiconductor layer and the p-type semiconductor layer, wherein the ground layer includes: an n-side ground layer provided on the n-type semiconductor layer and a p-side ground layer provided on the p-type semiconductor layer, the n-side ground layer and the p-side ground layer being separated from each other by a first separating groove having a first separating portion and a second separating portion that extend in different directions; and a first bridge portion that separates the first separating portion and the second separating portion, the n-side ground layer includes a first n-side ground portion that extends in the first direction, the p-side ground layer includes a first p-side ground portion that extends in the first direction and is provided adjacent to the first n-side ground portion, and the first bridge portion separates the first separating portion and the second separating portion at at least one of a border between the p-side ground layer and a first end portion of the first n-side ground portion on one side in the first direction or a border between the n-side ground layer and a second end portion of the first p-side ground portion on another side in the first direction.

A method for manufacturing a solar cell according to one aspect of the present invention is a method for manufacturing a back-junction solar cell, and the method includes: (a) forming an n-type semiconductor layer and a p-type semiconductor layer on a back surface of a semiconductor substrate having a light-receiving surface on which light is incident and the back surface opposite to the light-receiving surface, the n-type semiconductor layer and the p-type semiconductor layer extending in a first direction and being adjacent to each other in a second direction intersecting with the first direction; (b) forming a ground layer on the back surface on which the n-type semiconductor layer and the p-type semiconductor layer are formed; (c) forming a conductive layer on the ground layer; (d) applying a resist on the conductive layer in a region corresponding to a separating groove that separates the ground layer into an n-side ground layer and a p-side ground layer; (e) forming an n-side electrode and a p-side electrode through electrolytic plating with the conductive layer on which a resist film is formed in (d) serving as a seed layer; (f) scanning a laser to form a groove in the resist film so as to penetrate therethrough to reach the seed layer after (e); (g) forming the separating groove by etching the back surface on which the groove is formed; and (h) removing the resist film after (g), wherein in (f), an output of the laser is stopped at a position where a scanning path along which the laser is scanned intersects, and thus the separating groove where a first separating portion and a second separating portion that extend in different directions are separated is formed at the position.

Advantageous Effect of Invention

The present invention can achieve a solar cell with less damage on a semiconductor layer and so on and a method for manufacturing such a solar cell when laser machining is employed.

DESCRIPTION OF EXEMPLARY EMBODIMENTS

Figure 1:
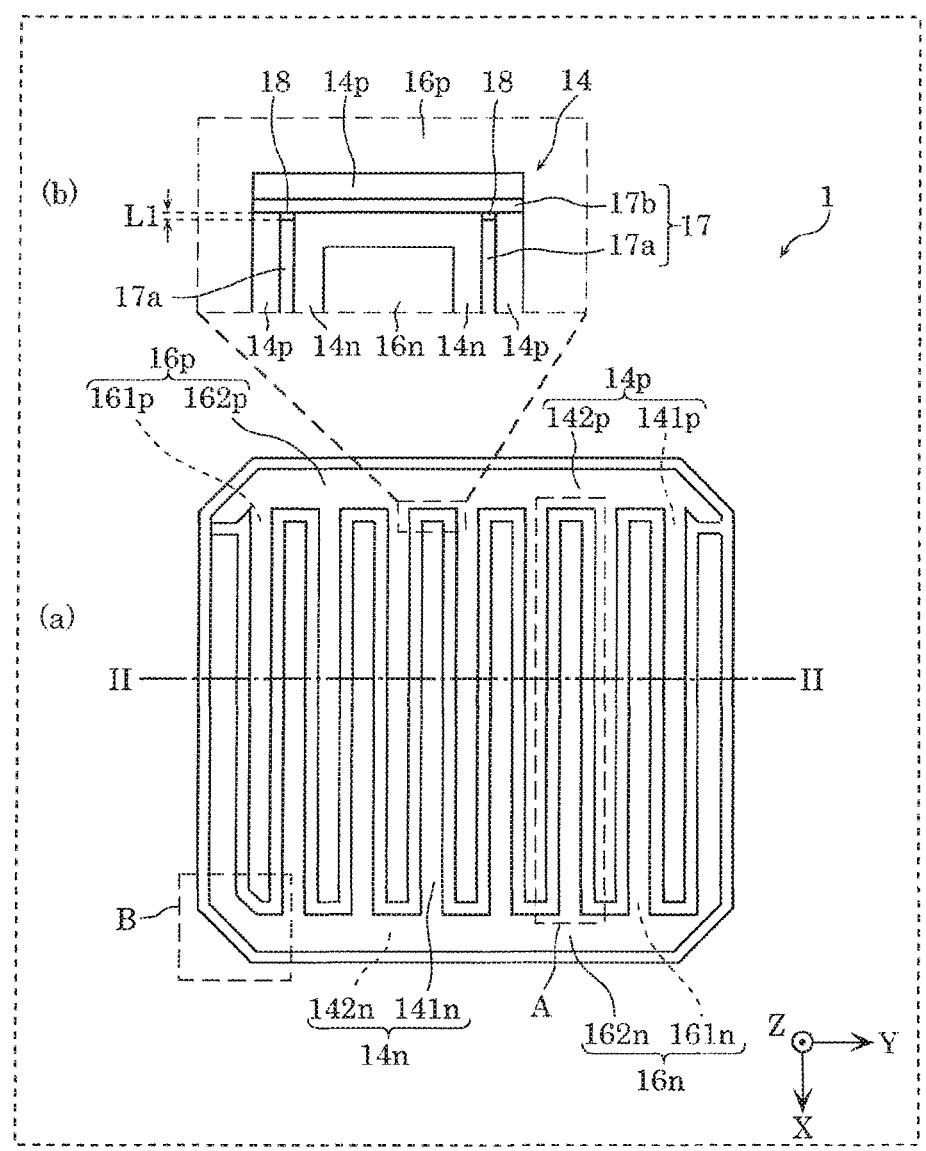
FIG. 1 is a plan view illustrating a solar cell according to Embodiment 1.

Hereinafter, embodiments of the present invention will be described in detail with reference to the drawings. The embodiments described below illustrate some specific examples of the present invention. Therefore, the numerical values, the shapes, the materials, the constituent elements, the arrangement of the constituent elements, the connection modes, the processes, the orders of the processes, and so on illustrated in the following embodiments are examples and are not intended to limit the present invention. Accordingly, among the constituent elements described in the following embodiments, any constituent element that is not described in an independent claim expressing the broadest concept of the present invention is to be construed as an optional constituent element.

The drawings are schematic diagrams and do not necessarily provide the exact depiction. In the drawings, substantially identical configurations are given identical reference characters, and duplicate descriptions thereof may be omitted or simplified.

The expression "substantially xxx" is intended to encompass a range that is considered to be substantially xxx. In one example, the expression "substantially orthogonal" is intended to encompass not only a case where entities are completely orthogonal but also a case where they are considered to be substantially orthogonal. For example, the expression "substantially xxx" is intended to allow a difference within, for example, around several percentages.

In the drawings, the Z-axis direction is the direction perpendicular to a light-receiving surface of a solar cell, for example. The X-axis direction and the Y-axis direction are orthogonal to each other and are both orthogonal to the Z-axis direction. For example, in the following embodiments, "viewed in a plan view" means that the entity is viewed in the Z-axis direction. In addition, in the following embodiments, "viewed in a sectional view" means that a section of a solar cell cut along a plane (e.g., a plane defined by the Z-axis and the X-axis) orthogonal to the light-receiving surface of the solar cell is viewed in the direction (e.g., the Y-axis direction) substantially orthogonal to the stated section.

Embodiment 1

Hereinafter, a solar cell according to the present embodiment will be described with reference to FIGS. 1 to 8.

[1. Configuration of Solar Cell]

First, with reference to FIGS. 1 and 2, a schematic configuration of the solar cell according to the present embodiment will be described. The solar cell is a photoelectric conversion element (a photovoltaic element) that converts light, such as the sunlight, into electric power.

FIG. 1 is a plan view illustrating solar cell 1 according to the present embodiment. FIG. 1 is a plan view in which solar cell 1 is viewed from its back surface side. Specifically, (a) in FIG. 1 is a plan view illustrating solar cell 1 according to the present embodiment, and (b) in FIG. 1 is an enlarged plan view of a section enclosed by a dashed line indicated in (a) in FIG. 1. FIG. 2 is a fragmentary sectional view of solar cell 1 according to the present embodiment, taken along the II-II line indicated in (a) in FIG. 1. In FIG. 2, light-receiving surface 10a on which light is incident faces downward in the paper plane.

Figure 2:
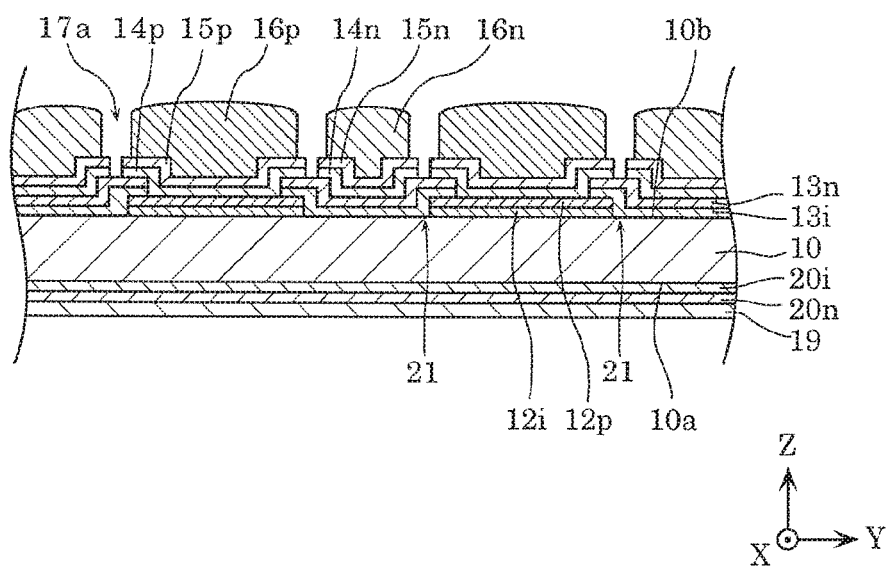
FIG. 2 is a fragmentary sectional view of the solar cell according to Embodiment 1, taken along the II-II line indicated in FIG. 1.

As illustrated in FIG. 2, solar cell 1 includes semiconductor substrate that is made of a semiconductor material. Semiconductor substrate 10 can be formed of, for example but not limited to, crystalline silicon. In an example described in the present embodiment, semiconductor substrate 10 is made of n-type crystalline silicon. It is to be noted that crystalline silicon includes monocrystalline silicon and polycrystalline silicon. Silicon substrate 10 may also be made of p-type crystalline silicon. In addition, the material for semiconductor substrate 10 may be a compound semiconductor, such as GaAs or InP.

Semiconductor substrate 10 has light-receiving surface 10a on which light is incident and back surface 10b that is opposite to light-receiving surface 10a. Semiconductor substrate 10 receives light at light-receiving surface 10a. Back surface 10b is a surface on which light is not incident directly. For solar cell 1 according to the present embodiment, semiconductor substrate 10 having a substantially octagonal shape is used, in which long sides that each extend in the X- or Y-direction and short sides that each extend in a direction intersecting with both the X-axis and the Y-axis are arranged in an alternating manner along the outer periphery of semiconductor substrate 10.

On light-receiving surface 10a of semiconductor substrate 10, substantially intrinsic i-type semiconductor layer 20i, n-type semiconductor layer 20n having a conductivity type identical to that of semiconductor substrate 10, and anti-reflection layer 19 (a protection layer) serving as a protection film are provided in this order. I-type semiconductor layer 20i can be formed of, for example but not limited to, substantially intrinsic i-type amorphous silicon. N-type semiconductor layer 20n can be formed of, for example but not limited to, n-type amorphous silicon. Anti-reflection layer 19 can be formed of, for example but not limited to, silicon nitride. Anti-reflection layer 19 also has a function of protecting i-type semiconductor layer 20i and n-type semiconductor layer 20n.

N-type semiconductor layer 13n and p-type semiconductor layer 12p are disposed on back surface 10b of semiconductor substrate 10.

N-type semiconductor layer 13n is disposed on a part of back surface 10b. N-type semiconductor layer 13n can be formed of, for example but not limited to, n-type amorphous silicon. Substantially intrinsic i-type semiconductor layer 13i is disposed between n-type semiconductor layer 13n and back surface 10b. I-type semiconductor layer 13i can be formed of, for example but not limited to, substantially intrinsic i-type amorphous silicon.

P-type semiconductor layer 12p is disposed at least in a portion of the part of back surface 10b where n-type semiconductor layer 13n is not disposed. This p-type semiconductor layer 12p and n-type semiconductor layer 13n cover substantially the entirety of back surface 10b.

P-type semiconductor layer 12p can be formed of, for example but not limited to, p-type amorphous silicon that includes a p-type dopant, such as boric acid. Substantially intrinsic i-type semiconductor layer 12i is disposed between p-type semiconductor layer 12p and back surface 10b. I-type semiconductor layer 12i can be formed of, for example but not limited to, substantially intrinsic i-type amorphous silicon.

From the standpoint of photoelectric conversion efficiency, it is desirable that n-type semiconductor layer 13n, i-type semiconductor layer 13i, p-type semiconductor layer 12p, and i-type semiconductor layer 12i be each formed along one direction that is parallel to back surface 10b. In the present embodiment, n-type semiconductor layer and i-type semiconductor layer 13n and 13i and p-type semiconductor layer and i-type semiconductor layer 12p and 12i each extend in the X-axis direction and are so provided as to interdigitate with each other in the Y-axis direction. In other words, n-type semiconductor layer and i-type semiconductor layer 13n and 13i and p-type semiconductor layer and i-type semiconductor layer 12p and 12i are provided adjacent to each other in the Y-axis direction. Here, the X-axis direction is an example of a first direction, and the Y-axis direction is an example of a second direction intersecting with the first direction. In the following description, n-type semiconductor layer 13n, p-type semiconductor layer 12p, and i-type semiconductor layers 12i and 13i are also referred to collectively as semiconductor layers. The semiconductor layers are laminated directly on back surface 10b of semiconductor substrate 10, for example.

It is preferable that the semiconductor layers be so formed as to cover a large area of back surface 10b of semiconductor substrate 10. To this end, it is preferable that n-type semiconductor layer and i-type semiconductor layer 13n and 13i and p-type semiconductor layer and i-type semiconductor layer 12p and 12i be laminated on top of each other. For example, as exemplified by separating portion 21 illustrated in FIG. 2, it is preferable that one set of the layers be so formed as to overlap the other set of the layers with no gap therebetween.

An insulation layer (not illustrated) is formed on the entire region of p-type semiconductor layer 12p where i-type semiconductor layer 13i and n-type semiconductor layer 13n are laminated. This configuration provides insulation between i-type semiconductor layer and p-type semiconductor layer 12i and 12p and i-type semiconductor layer and n-type semiconductor layer 13i and 13n.

N-side ground layer 14n, n-side conductive layer 15n, and n-side electrode 16n are laminated on n-type semiconductor layer 13n. Meanwhile, p-side ground layer 14p, p-side conductive layer 15p, and p-side electrode 16p are laminated on p-type semiconductor layer 12p. Herein, n-side conductive layer 15n and p-side conductive layer 15p are also referred to collectively as conductive layers. In addition, n-side electrode 16n and p-side electrode 16p are also referred to collectively as electrodes.

As illustrated in (b) in FIG. 1, n-side ground layer 14n, p-side ground layer 14p, and first bridge portion 18 constitute ground layer 14. In the present embodiment, one feature lies in that ground layer 14 includes first bridge portion 18.

Ground layer 14 has a function of keeping the semiconductor layers and the conductive layers from coming into contact with each other and keeping the semiconductor layers and the conductive layers from turning into an alloy to thus increase the reflectance of the incident light. For example, ground layer 14 is a transparent conductive layer (a TCO film) formed of a transparent conductive material. It is preferable that the transparent conductive layer be so formed as to include at least one metal oxide, such as indium oxide ($In_2O_3$), zinc oxide (ZnO), tin oxide ($SnO_2$), or titanium oxide (TiO), having a polycrystalline structure. These metal oxides may be doped with a dopant, such as tin (Sn), zinc (Zn), tungsten (W), antimony (Sb), titanium (Ti), aluminum (Al), cerium (Ce), or gallium (Ga). For example, ITO in which $In_2O_3$ is doped with Sn is particularly preferable. The concentration of the dopant can be 0 mass % to 20 mass %. The thickness of the transparent conductive layer is around 50 nm to 100 nm, for example.

Ground layer 14 is disposed on the semiconductor layers. For example, ground layer 14 is laminated directly on the semiconductor layers.

Ground layer 14 is separated into n-side ground layer 14n and p-side ground layer 14p by first separating groove 17 having first separating portion 17a and second separating portion 17b that extend in different directions. In other words, n-side ground layer 14n and p-side ground layer 14p that are separated from each other are formed by first separating groove 17. This configuration allows n-side ground layer 14n to be disposed on n-type semiconductor layer 13n and electrically connected to n-type semiconductor layer 13n. In addition, the above configuration allows p-side ground layer 14p to be disposed on p-type semiconductor layer 12p and electrically connected to p-type semiconductor layer 12p.

As illustrated in (a) in FIG. 1 and in FIG. 2, ground layer 14 is formed under the electrodes as well (e.g., between the electrodes and the semiconductor layers). As illustrated in (a) in FIG. 1, n-side ground layer 14n is constituted by first n-side ground portions 141n that each extend in the X-axis direction and second n-side ground portion 142n that extends in the Y-axis direction and connects an end portion of each first n-side ground portion 141n on the positive side in the X-axis direction. The end portion of first n-side ground portion 141n on the positive side in the X-axis direction is an example of an end portion on another side in the first direction. Meanwhile, p-side ground layer 14p is constituted by first p-side ground portions 141p that each extend in the X-axis direction and second p-side ground portion 142p that extends in the Y-axis direction and connects an end portion of each first p-side ground portion 141p on the negative side in the X-axis direction. The end portion of first p-side ground portion 141p on the negative side in the X-axis direction is an example of an end portion on one side in the first direction. In the present embodiment, first n-side ground portions 141n and first p-side ground portions 141p are so disposed as to be interposed between each other. In other words, first n-side ground portions 141n and first p-side ground portions 141p are disposed adjacent to each other.

First separating portion 17a extends in the X-axis direction as viewed in a plan view of solar cell 1 and is provided between first n-side ground portion 141n and first p-side ground portion 141p that are adjacent to each other. Second separating portion 17b is provided between an end portion of n-side ground layer 14n (specifically, first n-side ground portion 141n) on the negative side in the X-axis direction and second p-side ground portion 142p and also between an end portion of p-side ground layer 14p (specifically, first p-side ground portion 141p) on the positive side in the X-axis and second n-side ground portion 142n.

First bridge portion 18 is provided between first separating portion 17a and second separating portion 17b. In other words, first bridge portion 18 separates first separating portion 17a and second separating portion 17b. In the present embodiment, first bridge portion 18 is provided between an end portion of first separating portion 17a in the X-axis direction and second separating portion 17b. In other words, first bridge portion 18 separates an end portion of first separating portion 17a in the X-axis direction and second separating portion 17b. Accordingly, first separating portion 17a and second separating portion 17b do not intersect with each other as viewed in a plan view.

In the example illustrated in (b) in FIG. 1, first bridge portion 18 separates first separating portion 17a and second separating portion 17b at a border between an end portion of n-side ground layer 14n (specifically, first n-side ground portion 141n) on the negative side in the X-axis direction and p-side ground layer 14p. First bridge portion 18 also separates first separating portion 17a and second separating portion 17b in a similar manner at a border between an end portion of p-side ground layer 14p (specifically, first p-side ground portion 141p) on the positive side in the X-axis direction and n-side ground layer 14n. First bridge portion 18 is provided at at least one of borders between a plurality of end portions of n-side ground layers 14n on the positive side in the X-axis direction and p-side ground layer 14p or borders between a plurality of end portions of p-side ground layers 14p on the negative side in the X-axis direction and n-side ground layer 14n. In other words, it suffices that solar cell 1 include at least one first bridge portion 18. In the example illustrated in (b) in FIG. 1, the shape of first bridge portion 18 as viewed in a plan view is substantially a rectangle, but this is not a limiting example.

An end portion of n-side ground layer 14n (specifically, first n-side ground portion 141n) on the negative side in the X-axis direction is an example of a first end portion, and an end portion of p-side ground layer 14p (specifically, first p-side ground portion 141p) on the positive side in the X-axis direction is an example of a second end portion. In the example illustrated in (b) in FIG. 1, the length of second separating portion 17b (the length in the Y-axis direction) is greater than the gap between adjacent first separating portions 17a (see gap L2 indicated in (a) and (b) in FIG. 8).

Disposing first bridge portion 18 at the position described above allows n-side ground layer 14n and p-side ground layer 14p to be connected to each other via first bridge portion 18. First bridge portion 18 is formed of a material identical to that of n-side ground layer 14n and p-side ground layer 14p, and thus first bridge portion 18 has a conductive property. However, first bridge portion 18 has a high resistance value, and thus n-side ground layer 14n and p-side ground layer 14p become electrically continuous only to an extent that does not affect the photoelectric conversion efficiency. For example, the resistance of first bridge portion 18 between n-side ground layer 14n and p-side ground layer 14p is no lower than 0.01 Ω·cm. For example, first bridge portion 18 has length L1 of no more than 30 μm in the X-axis direction and a length (width L3 indicated in (a) and (b) in FIG. 8) of no more than 30 μm in the Y-axis direction. The length of first bridge portion 18 in the Y-axis direction is substantially equal to the length of first separating portion 17a in its widthwise direction. In addition, length L1 of first bridge portion 18 in the X-axis direction is preferably no greater than the length (width L3 in the present embodiment) of first bridge portion 18 in the Y-axis direction.

The conductive layers are disposed on ground layer 14 and function as seed layers through which a current flows in plating growth. In other words, n-side electrode 16n and p-side electrode 16p are formed through electrolytic plating with the conductive layers serving as seed layers. The thickness of the conductive layers is around 50 nm to 100 nm, for example.

N-side electrode 16n is an electrode that is formed directly on n-side conductive layer 15n and collects carriers (electrons) from n-type semiconductor layer 13n. P-side electrode 16p is an electrode that is formed directly on p-side conductive layer 15p and collects carriers (holes) from p-type semiconductor layer 12p.

In the present embodiment, n-side electrode 16n is a plating layer disposed on n-side conductive layer 15n, and p-side electrode 16p is a plating layer disposed on p-side conductive layer 15p. N-side electrode 16n is constituted by n-side finger electrodes 161n that each extend in the X-axis direction and n-side busbar electrode 162n that extends in the Y-axis direction and connects an end portion of each n-side finger electrode 161n on the positive side in the X-axis direction. Meanwhile, p-side electrode 16p is constituted by p-side finger electrodes 161p that each extend in the X-axis direction and p-side busbar electrode 162p that extends in the Y-axis direction and connects an end portion of each p-side finger electrode 161p on the negative side in the X-axis direction. In the present embodiment, n-side finger electrodes 161n and p-side finger electrodes 161p are so disposed as to be interposed between each other. In other words, n-side finger electrodes 161n and p-side finger electrodes 161p are disposed adjacent to each other.

It is preferable that n-side conductive layer 15n, n-side electrode 16n, p-side conductive layer 15p, and p-side electrode 16p be formed of a metal that is highly conductive and has a high optical reflectance. For example, it is preferable that n-side conductive layer 15n, n-side electrode 16n, p-side conductive layer 15p, and p-side electrode 16p be formed of a metal, such as copper (Cu), tin (Sn), titanium (Ti), aluminum (Al), nickel (Ni), silver (Ag), or gold (Au), or an alloy that includes at least one of these metals. In other words, n-side conductive layer 15n, n-side electrode 16n, p-side conductive layer 15p, and p-side electrode 16p are metal layers.

In the present embodiment, n-side conductive layer 15n, n-side electrode 16n, p-side conductive layer 15p, and p-side electrode 16p are formed of Cu, from the standpoint of, for example but not limited to, the conductive property, the reflectance, and the material costs. The thickness of each Cu layer is around 10 μm to 20 μm, for example.

As described above, solar cell 1 according to the present embodiment is a back-junction solar cell. In a case where n-side electrode 16n and p-side electrode 16p are to be formed through printing or the like, n-side conductive layer 15n and p-side conductive layer 15p do not need to be provided.

[2. Method for Manufacturing Solar Cell]

Next, with reference to FIGS. 3 to 8, a method for manufacturing solar cell 1 described above will be described.

Figure 3:
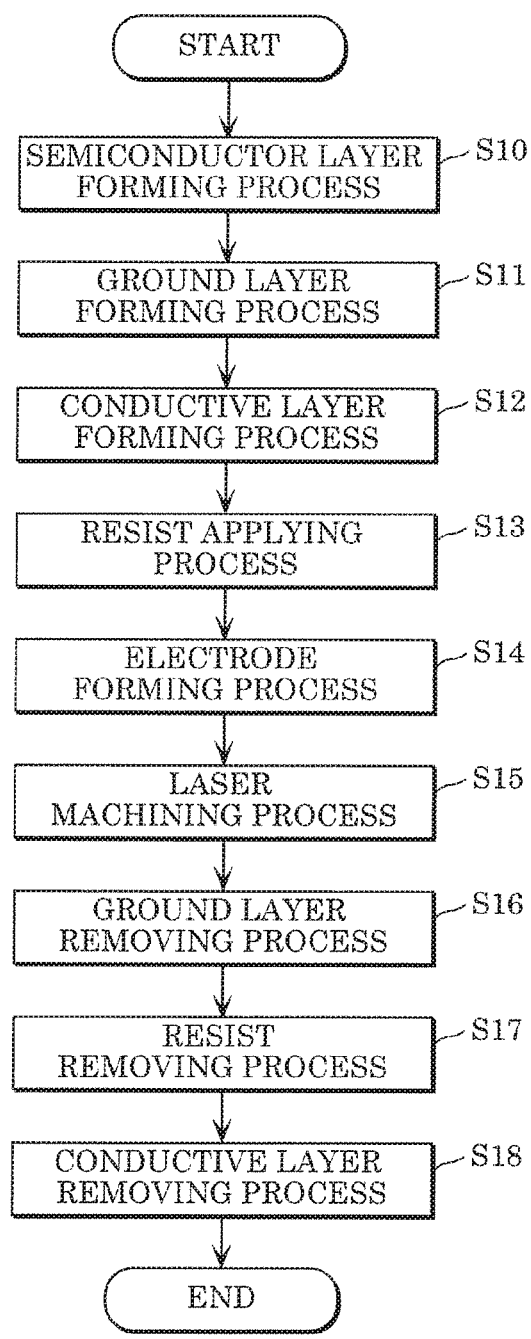
FIG. 3 is a flowchart illustrating a method for manufacturing the solar cell according to Embodiment 1.

FIG. 3 is a flowchart illustrating the method for manufacturing the solar cell according to the present embodiment. One feature of the manufacturing method according to the present embodiment lies in a laser machining process.

As illustrated in FIG. 3, first, a semiconductor layer forming process (S10) is performed. In the semiconductor layer forming process, n-type semiconductor layer 13n and p-type semiconductor layer 12p that extend in the first direction (the X-axis direction in the present embodiment) and are provided adjacent to each other in the second direction (the Y-axis direction in the present embodiment) intersecting with the first direction are formed on back surface 10b of semiconductor substrate 10 having light-receiving surface 10a on which light is incident and back surface 10b opposite to light-receiving surface 10a. In the semiconductor layer forming process, semiconductor substrate 10 is placed in a vacuum chamber, and an i-type semiconductor layer and an n-type semiconductor layer are laminated successively through plasma-enhanced chemical vapor deposition (PECVD) or sputtering. In the semiconductor layer forming process, a semiconductor layer and so on are formed also on light-receiving surface 10a.

In the semiconductor layer forming process, first, i-type semiconductor layer 20i and n-type semiconductor layer 20n are laminated on light-receiving surface 10a of semiconductor substrate 10, and i-type semiconductor layer 12i, p-type semiconductor layer 12p, and an insulation layer (not illustrated) are laminated on back surface 10b. The insulation layer can be formed with a composition similar to that of anti-reflection layer 19, for example.

In the process of laminating i-type semiconductor layers 12i and 20i through PECVD, a gas obtained by diluting silane gas ($SiH_4$) with hydrogen ($H_2$) is used as a source material gas, for example. Meanwhile, in the process of laminating n-type semiconductor layers 13n and 20n, a gas obtained by adding phosphine ($PH_3$) to silane ($SiH_4$) and diluting this with hydrogen ($H_2$) is used as a source material gas, for example. In the process of laminating p-type semiconductor layer 12p, a gas obtained by adding diborane ($B_2He$) to silane ($SiH_4$) and diluting this with hydrogen ($H_2$) is used as a source material gas, for example.

Thereafter, the layers laminated on back surface 10b are patterned. First, the insulation layer is partially removed through etching. In the process of etching the insulation layer, a resist film formed through a photolithography process, a coating process with screen printing or inkjet, or the like is used as a mask, for example. In a case where the insulation layer includes silicon oxide ($SiO_2$), silicon nitride (SiN), or silicon oxynitride (SiON), the insulation layer can be etched with the use of a hydrogen fluoride (HF) aqueous solution, for example.

After the insulation layer has been etched, the resist film is removed, and exposed i-type semiconductor layer 12i and p-type semiconductor layer 12p are etched with the patterned insulation layer serving as a mask, for example. I-type semiconductor layer 12i and p-type semiconductor layer 12p are etched with the use of an alkaline etching solution, such as a sodium hydroxide (NaOH) aqueous solution (e.g., a 1 mass % NaOH aqueous solution), for example. Through this process, patterned i-type semiconductor layer 12i and p-type semiconductor layer 12p and the insulation layer are formed on back surface 10b.

Here, it is preferable that a textured structure be formed in light-receiving surface 10a of semiconductor substrate 10 before i-type semiconductor layer 20i is laminated thereon. The textured structure can be formed by subjecting a (100) plane to anisotropic etching with the use of a potassium hydroxide (KOH) aqueous solution, for example.

Thereafter, i-type semiconductor layer 13i and n-type semiconductor layer 13n are laminated on the entire region of back surface 10b excluding its edge region. In other words, i-type semiconductor layer 13i and n-type semiconductor layer 13n are laminated also on patterned i-type semiconductor layer 12i and p-type semiconductor layer 12p. I-type semiconductor layer 13i and n-type semiconductor layer 13n can be formed through PECVD, as with i-type semiconductor layer 12i and p-type semiconductor layer 12p.

Thereafter, i-type semiconductor layer 13i and n-type semiconductor layer 13n laminated on i-type semiconductor layer 12i and p-type semiconductor layer 12p are patterned to partially remove the insulation layer. First, i-type semiconductor layer 13i and n-type semiconductor layer 13n laminated on i-type semiconductor layer 12i and p-type semiconductor layer 12p are partially removed through etching. The regions of i-type semiconductor layer 13i and n-type semiconductor layer 13n that are to be removed are regions on i-type semiconductor layer 12i and p-type semiconductor layer 12p where p-side electrode 16p is to be formed in a later process. I-type semiconductor layer 13i and n-type semiconductor layer 13n are etched with the use of an alkaline etching solution, such as a NaOH aqueous solution, and with a resist film formed through screen printing or the like used as a mask, for example.

I-type semiconductor layer 13i and n-type semiconductor layer 13n can typically be etched less easily than i-type semiconductor layer 12i and p-type semiconductor layer 12p. Therefore, it is preferable to use a NaOH aqueous solution (e.g., a 10 mass % NaOH aqueous solution) having a higher concentration than a NaOH aqueous solution used to etch i-type semiconductor layer 12i and p-type semiconductor layer 12p, or it is preferable to use nitric-hydrofluoric acid (a mixed aqueous solution of HF and $HNO_3$ (e.g., 30 mass % each)). Alternatively it is preferable to use a NaOH aqueous solution that has been heated to around 70° C. to 90° C. (thermal alkaline treatment).

After i-type semiconductor layer 13i and n-type semiconductor layer 13n have been etched, the resist film is removed, and the exposed insulation layer is removed through etching with the use of a HF aqueous solution and with patterned i-type semiconductor layer 13i and n-type semiconductor layer 13n used as a mask. Then, as a portion of the insulation layer is removed, portions of i-type semiconductor layer 12i and p-type semiconductor layer 12p become exposed.

Next, a ground layer forming process (S11) and a conductive layer forming process (S12) are performed. In the ground layer forming process, ground layer 14 is formed on back surface 10b on which p-type semiconductor layer 12p and n-type semiconductor layer 13n have been formed. In the conductive layer forming process, conductive layer 15 is formed on ground layer 14. Ground layer 14 and conductive layer 15 are laminated on the entire region of p-type semiconductor layer 12p and n-type semiconductor layer 13n.

Now, with reference to FIG. 4, the solar cell fabricated so far through the processes in steps S10 to S12 will be described.

Figure 4:
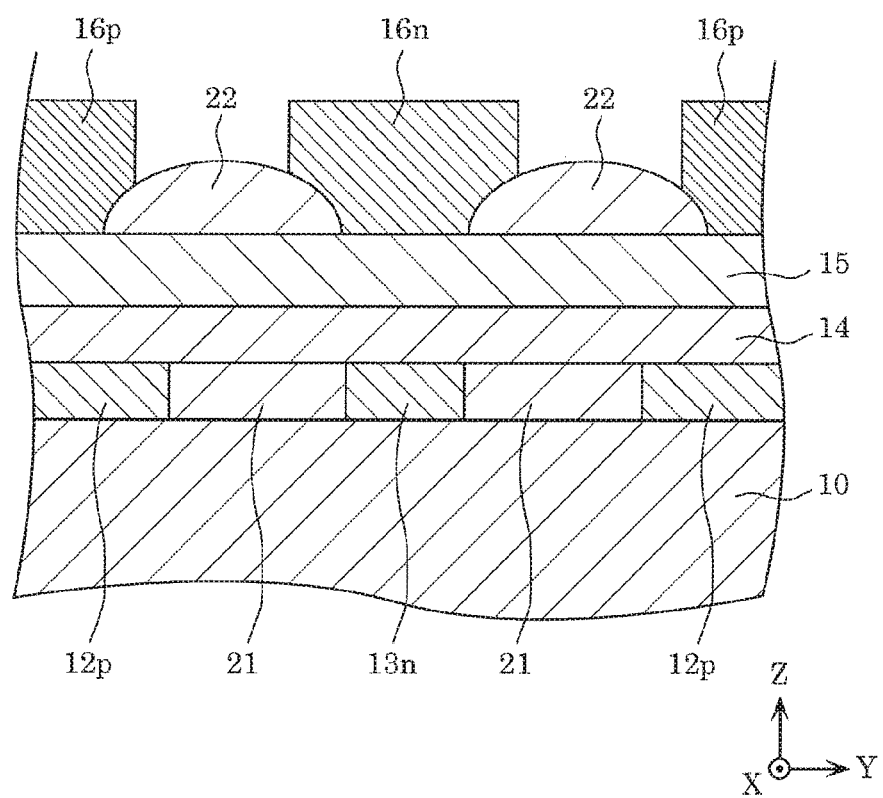
FIG. 4 is a schematic sectional view of the solar cell according to Embodiment 1, illustrating a state held after an electrode forming process.

FIG. 4 is a schematic sectional view of solar cell 1 according to the present embodiment, illustrating a state held after an electrode forming process.

Through the processes in steps S10 to S12, of the constituent elements illustrated in FIG. 4, those excluding n-side electrode 16n, p-side electrode 16p, and resist film 22 are formed. Ground layer 14 and conductive layer 15 are formed continuously.

Referring back to FIG. 3, a resist applying process is performed (S13). In the resist applying process, a resist is applied onto conductive layer 15 in a region corresponding to a separating groove separating n-side electrode 16n and p-side electrode 16p (e.g., the region between n-side electrode 16n and p-side electrode 16p illustrated in (b) in FIG. 1). Resist film 22 formed in the resist applying process is formed along a region on conductive layer 15 corresponding to separating portion 21. In other words, after the resist applying process, resist film 22 and separating portion 21 at least partially overlap each other and extend in respective directions parallel to each other as viewed in a plan view of solar cell 1.

In the resist applying process, resist film 22 is formed through screen printing, for example. Therefore, as illustrated in FIG. 4, resist film 22 has a semicylindrical shape. It is to be noted that the method for forming resist film 22 is not limited to the screen printing method, and a dispenser method or any other method may be employed.

Resist film 22 preferably has a thickness that is sufficient to keep incomplete resist removal from occurring in laser machining in the later-performed laser machining process. In addition, resist film 22 preferably has a thickness that is sufficient to keep thinning, as in a pinhole, from occurring when resist film 22 is formed. For example, the thickness that is sufficient to keep any thinning from occurring in resist film 22 is, for example, no less than μm. For example, the thickest portion of semicylindrical resist film 22 illustrated in FIG. 4 has a thickness of no less than 15 μm. If the thickness is less than 15 μm, a thinned portion occurs, and plating grows from this thinned portion to cause a short circuit in the later-performed electrode forming process.

Thereafter, the electrode forming process is performed (S14). In the electrode forming process, n-side electrode 16n and p-side electrode 16p are formed through electrolytic plating with conductive layer 15 having resist film 22 formed thereon serving as a seed layer. Here, a plating layer is so formed as to be divided by resist film 22, and the plating layer becomes separated to yield n-side electrode 16n and p-side electrode 16p. In this process, since conductive layer 15 is not patterned, the surface density of the current that flows in the plating treatment becomes equal, which allows n-side electrode 16n and p-side electrode 16p to have substantially the same thickness.

In the present embodiment, since n-side electrode 16n and p-side electrode 16p are each formed by a Cu layer. Cu plating is performed to form n-side electrode 16n and p-side electrode 16p.

FIG. 4 illustrates the solar cell in which n-side electrode 16n and p-side electrode 16p have been formed in step S14. N-side electrode 16n and p-side electrode 16p are formed in regions where resist film 22 is not formed. As illustrated in FIG. 4, ground layer 14 and conductive layer 15 have not been patterned at the time of step S14. Thus, n-type semiconductor layer 13n and p-type semiconductor layer 12p are electrically continuous via ground layer 14 and conductive layer 15, for example. Therefore, ground layer 14 and conductive layer 15 are to be partially etched.

Figure 5A:
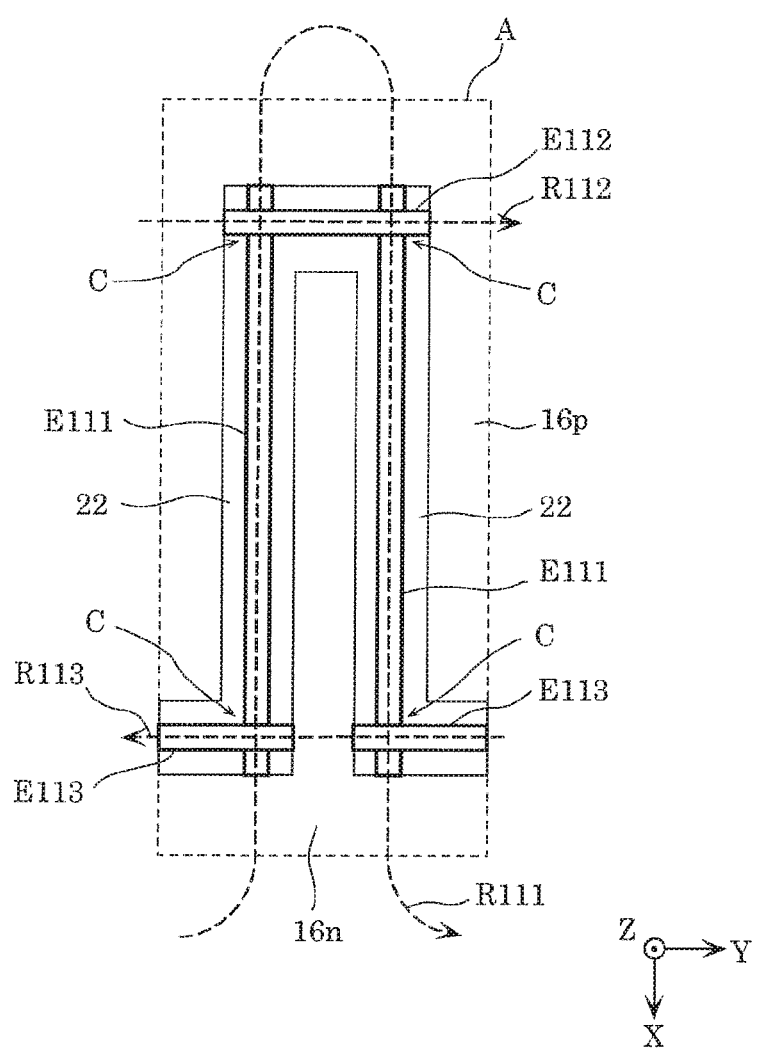
FIG. 5A is a plan view illustrating a scanning path of a laser in a laser machining process according to a comparative example.
Figure 5B:
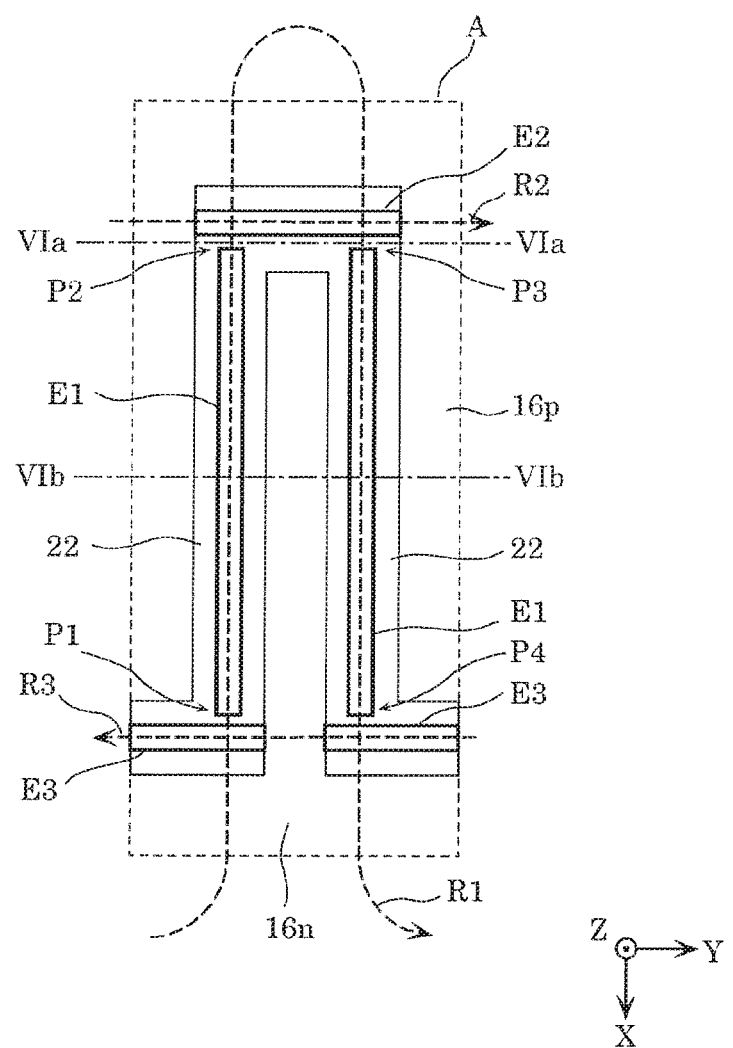
FIG. 5B is a plan view illustrating a scanning path of a laser in a laser machining process according to Embodiment 1.

To partially etch ground layer 14 and conductive layer 15, first, a laser machining process is performed (S15). In the laser machining process, resist film 22 is partially removed through laser irradiation. With reference to FIGS. 5A and 5B, a scanning path of a laser in a laser machining process will be described.

FIG. 5A is a plan view illustrating a scanning path of a laser in a laser machining process according to a comparative example. FIG. 5B is a plan view illustrating a scanning path of a laser in a laser machining process according to the present embodiment. In each of FIGS. 5A and 5B, the scanning path of the laser is indicated by the dashed arrows, and an irradiation range of the laser is indicated by the solid frames.

As illustrated in FIG. 5A, in the comparative example, the laser is scanned along scanning paths R111 to R113. Specifically, in the scan along scanning path R111, resist film 22 in the range of irradiation range E111 is irradiated with the laser. In a similar manner, in the scans along R112 and R113, resist film 22 in the ranges of respective irradiation ranges E112 and E113 is irradiated with the laser.

It is to be noted that the regions where n-side electrode 16n and p-side electrode 16p are formed are not irradiated with the laser. In other words, the output of the laser is stopped for the regions where n-side electrode 16n and p-side electrode 16p are formed. Specifically, in the comparative example, the output of the laser is controlled on or off at a border between the region where n-side electrode 16n or p-side electrode 16p is formed and the region where neither n-side electrode 16n nor p-side electrode 16p is formed.

Here, it can be seen that four intersections C are irradiated with the laser excessively. For example, irradiation ranges E111 and E112 overlap at two intersections C on the negative side in the X-axis direction. In other words, these intersections C are irradiated with the laser in the scan along scanning path R111 as well as in the scan along scanning path R112. This may cause damage to the semiconductor layers and so on, and the photoelectric conversion efficiency of the solar cell may decrease. Accordingly, the present embodiment keeps any single position from being irradiated with a laser excessively. In the present embodiment, when one position is irradiated with a laser along each of different scanning paths, that position is said to be irradiated with the laser twice.

As illustrated in FIG. 5B, in the present embodiment, a laser is scanned along scanning paths R1 to R3. For example, scanning paths R1 to R3 may be identical to scanning paths R111 to R113 illustrated in FIG. 5A. Specifically, in the scan along scanning path R1, resist film 22 in the range of irradiation range E1 is irradiated with the laser. In a similar manner, in the scans along scanning paths R2 and R3, resist film 22 in the ranges of respective irradiation ranges E2 and E3 is irradiated with the laser. Scanning path R1 includes a first half and a second half. In the first half, the laser is scanned from the side of irradiation range E3 toward irradiation range E2 (from the positive side in the X-axis direction toward the negative side in the X-axis direction in FIG. 5B). In the second half, the laser is scanned from the side of irradiation range E2 toward the side of irradiation range E3 (from the negative side in the X-axis direction toward the positive side in the X-axis direction in FIG. 5B). Here, scanning paths R1 to R3 are set in advance before the laser machining is performed. In other words, irradiation ranges E2 and E3 are ranges that can be found in advance. In the example illustrated in FIG. 5B, irradiation ranges E1 to E3 are each a line arrange.

In FIG. 5B, unlike intersection C illustrated in FIG. 5A, there is no region where the irradiation ranges of the laser intersect. In other words, with the method for manufacturing the solar cell according to the present embodiment, no one position is irradiated with a laser twice. For example, this can be achieved by controlling on and off of the output of the laser while the laser is scanning along scanning path R1.

Specifically, the laser starts being output at position P1 that is past irradiation range E3 in scanning path R1 (in the first half). In other words, no laser irradiation is performed before scanning path R1 reaches position P1. The distance between irradiation range E3 and position P1 is substantially equal to length L1 indicated in (b) in FIG. 1.

Thereafter, laser irradiation is performed until scanning path R1 passes position P2. Position P2 is a position in scanning path R1 where scanning path R1 has not reached irradiation range E2. In other words, no laser irradiation is performed in scanning path R1 while scanning path R1 passes through irradiation range E2. The distance between irradiation range E2 and position P2 is substantially equal to the distance between irradiation range E3 and position P1. This configuration forms elongated irradiation range E1 extending from position P1 to position P2.

The laser starts being output at position P3 that is past irradiation range E2 in scanning path R1 (in the second half). In other words, no laser irradiation is performed until scanning path R1 reaches position P3 from position P2. The distance between irradiation range E2 and position P3 is substantially equal to the distance between irradiation range E2 and position P2.

Thereafter, laser irradiation is performed until scanning path R1 reaches position P4. Position P4 is a position in scanning path R1 where scanning path R1 has not reached irradiation range E3. In other words, no laser irradiation is performed in scanning path R1 while scanning path R1 passes through irradiation range E3. The distance between irradiation range E3 and position P4 is substantially equal to the distance between irradiation range E3 and position P1. This configuration forms elongated irradiation range E1 extending from position P3 to position P4.

As described above, in scanning path R1, the laser stops being output at a position where scanning path R1 intersects with scanning path R2 or R3. For example, in scanning path R1, the laser stops being output at a position where scanning path R1 intersects with irradiation range E2 or E3.

Thereafter, irradiation ranges E2 and E3 are irradiated with the laser along respective scanning paths R2 and R3. For example, in scanning paths R2 and R3, the output of the laser is turned on or off at a border between a region where n-side electrode 16$n$ or p-side electrode 16$p$ is formed and a region where neither n-side electrode 16$n$ nor p-side electrode 16$p$ is formed.

As described thus far, in the laser machining process, the output of the laser is turned on or off along scanning path R1 (the first half and the second half) in the regions between irradiation ranges E2 and E3. This configuration keeps irradiation range E1 from intersecting (overlapping) with either of irradiation ranges E2 and E3, and thus no one position is irradiated with the laser twice. In other words, this makes it possible to keep the semiconductor layers and so on from being damaged by the laser.

In the example described with reference to FIG. 5B, the output of the laser is turned on or off in the regions between irradiation ranges E2 and E3 along scanning path R1, but this is not a limiting example. For example, the output of the laser may be turned on or off in the regions between two irradiation ranges E1 along scanning paths R2 and R3. Specifically, in scanning path R1, the output of the laser is turned on or off at a border between a region where n-side electrode 16$n$ or p-side electrode 16$p$ is formed and a region where neither n-side electrode 16$n$ nor p-side electrode 16$p$ is formed. Then, the output of the laser may be turned on or off in the regions between two irradiation ranges E1 along scanning paths R2 and R3.

Now, with reference to FIGS. 6A and 6B, the solar cell that has undergone the laser machining process will be described.

Figure 6A:
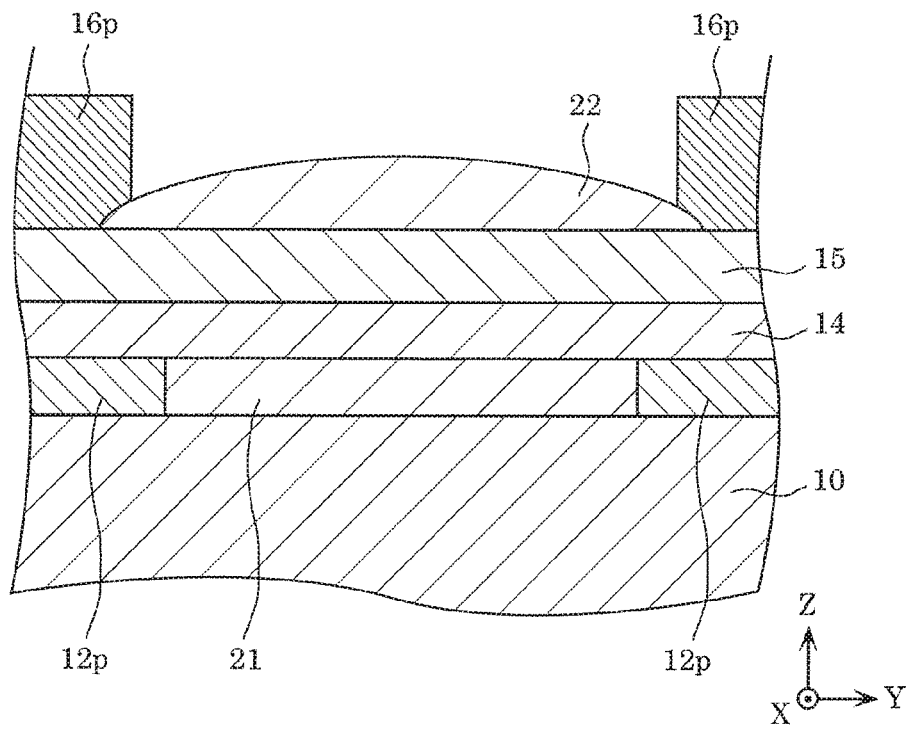
FIG. 6A is a fragmentary sectional view of the solar cell according to Embodiment 1, taken along the VIa-VIa line indicated in FIG. 5B and illustrating a state held during a manufacturing process.
Figure 6B:
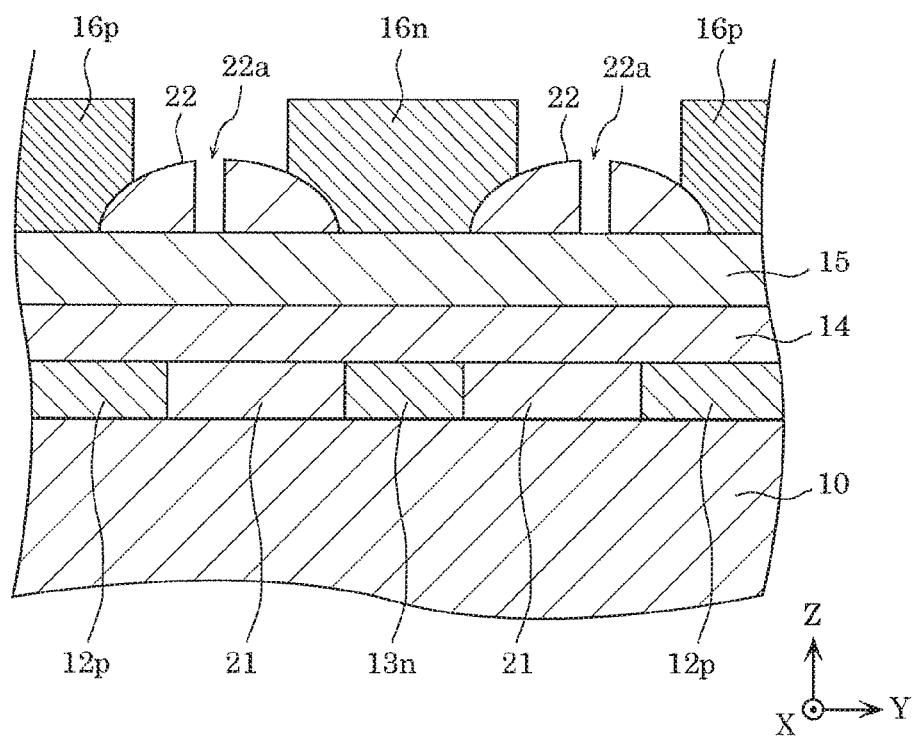
FIG. 6B is a fragmentary sectional view of the solar cell according to Embodiment 1, taken along the VIb-VIb line indicated in FIG. 5B and illustrating a state held during the manufacturing process.

FIG. 6A is a fragmentary sectional view of solar cell 1 according to the present embodiment, taken along the VIa-VIa line indicated in FIG. 6B and illustrating a state held during the manufacturing process. Specifically, FIG. 6A is a fragmentary sectional view of a region that is not irradiated with the laser in the laser machining process. FIG. 6B is a fragmentary sectional view of solar cell 1 according to the present embodiment, taken along the VIb-VIb line indicated in FIG. 5B and illustrating a state held during the manufacturing process. Specifically, FIG. 6B is a fragmentary sectional view of a region that has been irradiated with the laser in the laser machining process.

As illustrated in FIG. 6A, no groove is formed in resist film 22 in the region where resist film 22 is not irradiated with the laser. In other words, resist film 22 remains in the state held when resist film 22 has been formed in step S13.

As illustrated in FIG. 6B, groove 22$a$ that penetrates through resist film 22 to reach conductive layer 15 is formed in the region where resist film 22 has been irradiated with the laser. In FIG. 6B, grooves 22$a$ corresponding to irradiation ranges E1 are formed.

Referring back to FIG. 3, next, a ground layer removing process is performed (S16). In the ground layer removing process, back surface 10$b$ on which resist film 22 with groove 22$a$ is formed is etched to form first separating groove 17 that separates ground layer 14 into n-side ground layer 14$n$ and $p$-side ground layer 14$p$.

In the ground layer removing process, first, conductive layer 15 is partially etched with resist film 22 serving as a mask. This causes conductive layer 15 to be split at the separating groove, and n-side conductive layer 15$n$ and p-side conductive layer 15$p$ that are separated from each other are formed. Conductive layer 15 can be etched with the use of a ferric chloride ($FeCl_3$) aqueous solution, a hydrochloric acid hydrogen peroxide mixture, or a sulfuric acid hydrogen peroxide mixture, for example. With this process, a portion of ground layer 14, which is a transparent conductive layer, becomes exposed.

Thereafter, exposed ground layer 14 is etched with resist film 22 and conductive layer 15 separated at the separating groove serving as a mask. This causes ground layer 14 to be separated at first separating groove 17, and n-side ground layer 14n and p-side ground layer 14p (see FIG. 7B described later) that are separated from each other are formed. Ground layer 14 can be etched with the use of a hydrogen chloride (HCl) aqueous solution or an oxalic acid aqueous solution, for example.

Now, with reference to FIGS. 7A and 7B, solar cell 1 that has undergone the ground layer removing process will be described.

Figure 7A:
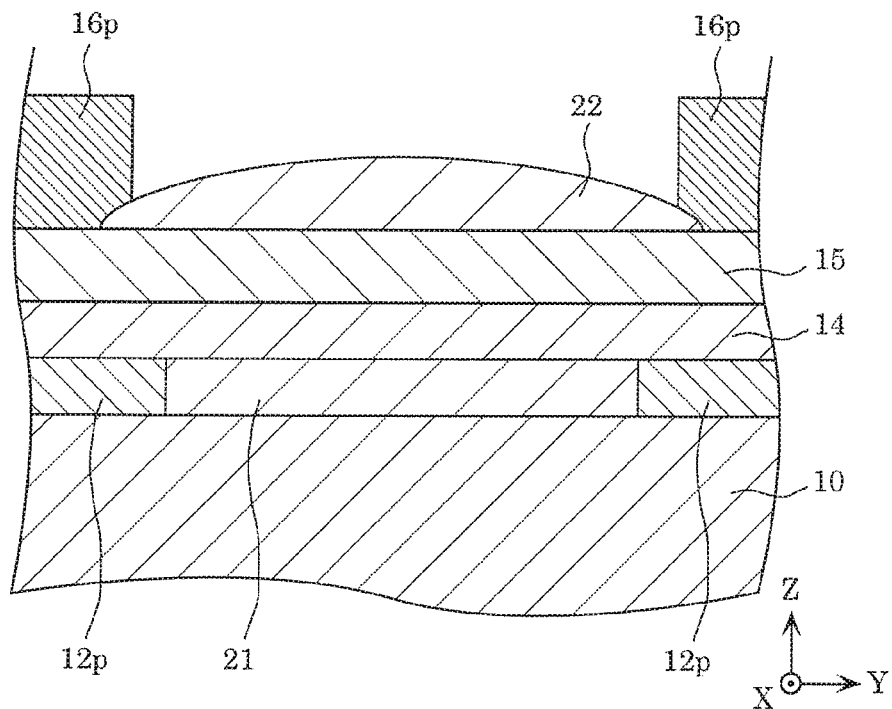
FIG. 7A is a fragmentary sectional view of the solar cell according to Embodiment 1, taken along a position corresponding to the VIa-VIa line indicated in FIG. 5B and illustrating a state held after a ground layer removing process.

FIG. 7A is a fragmentary sectional view of solar cell 1 according to the present embodiment, taken along the position corresponding to the VIa-VIa line indicated in FIG. 5B and illustrating a state held after the ground layer removing process. In other words, FIG. 7A is a fragmentary sectional view of a region that is not irradiated with the laser in the laser machining process. FIG. 7B is a fragmentary sectional view of solar cell 1 according to the present embodiment, taken along the position corresponding to the VIb-VIb line indicated in FIG. 5B and illustrating a state held after the ground layer removing process. In other words, FIG. 7B is a fragmentary sectional view of a region that has been irradiated with the laser in the laser machining process.

As illustrated in FIG. 7A, neither conductive layer 15 nor ground layer 14 is etched in the region where resist film 22 is not irradiated with the laser. In other words, conductive layer 15 and ground layer 14 each remain in the state held when conductive layer 15 and ground layer 14 are formed in steps S11 and S12, respectively.

Figure 7B:
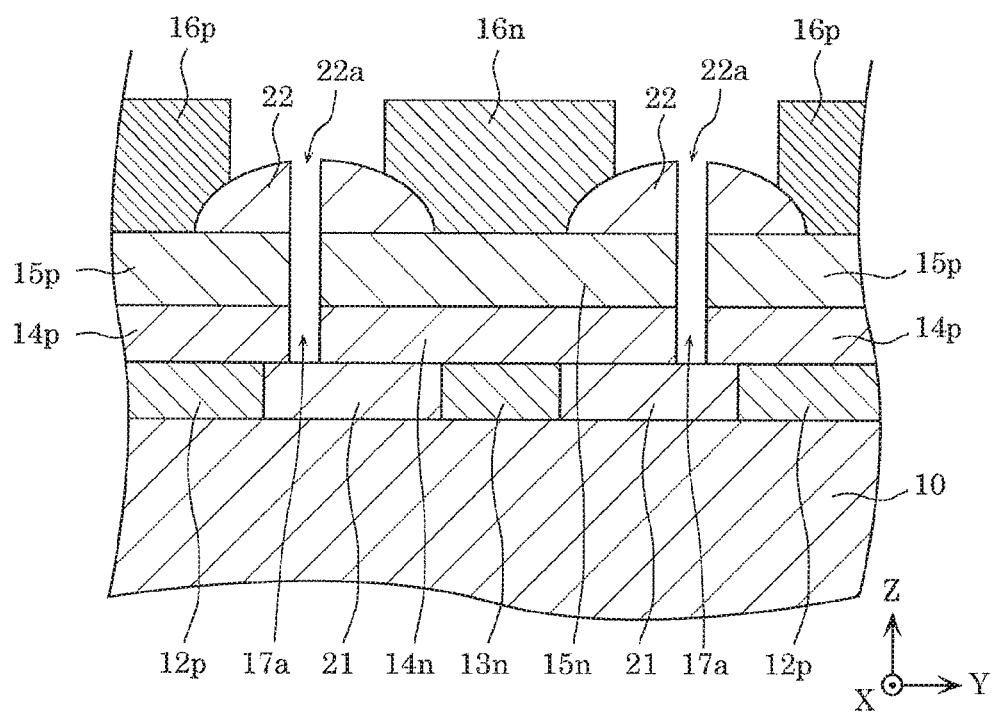
FIG. 7B is a fragmentary sectional view of the solar cell according to Embodiment 1, taken along a position corresponding to the VIb-VIb line indicated in FIG. 5B and illustrating a state held after the ground layer removing process.

As illustrated in FIG. 7B, a separating groove that penetrates through conductive layer 15 and ground layer 14 is formed at the position corresponding to groove 22a in resist film 22 in the region where resist film 22 has been irradiated with the laser. For example, in conductive layer 15, n-side conductive layer 15n and p-side conductive layer 15p that are separated from each other are formed by the stated separating groove. Meanwhile, in ground layer 14, n-side ground layer 14n and p-side ground layer 14p that are separated from each other are formed by the stated separating groove. Of the separating groove that penetrates through conductive layer 15 and ground layer 14, the portion that separates n-side ground layer 14n and p-side ground layer 14p is referred to as first separating groove 17 (first separating portion 17a in FIG. 7B). In other words, first separating groove 17 is a groove that separates n-side ground layer 14n and p-side ground layer 14p.

Referring back to FIG. 3, after the ground layer removing process, a resist removing process (S17) and a conductive layer removing process (S18) are performed. In the resist removing process, resist film 22 is removed. In the conductive layer removing process, a portion of n-side conductive layer 15n and a portion of p-side conductive layer 15p are removed.

In the resist removing process, resist film 22 is removed by an alkaline solution, such as NaOH or KOH. Then, in the conductive layer removing process, n-side conductive layer 15n and p-side conductive layer 15p can be etched with the use of a ferric chloride ($FeCl_3$) aqueous solution, a hydrochloric acid hydrogen peroxide mixture, or a sulfuric acid hydrogen peroxide mixture.

Now, with reference to FIG. 8, solar cell 1 that has undergone the resist removing process and the conductive layer removing process will be described.

Figure 8:
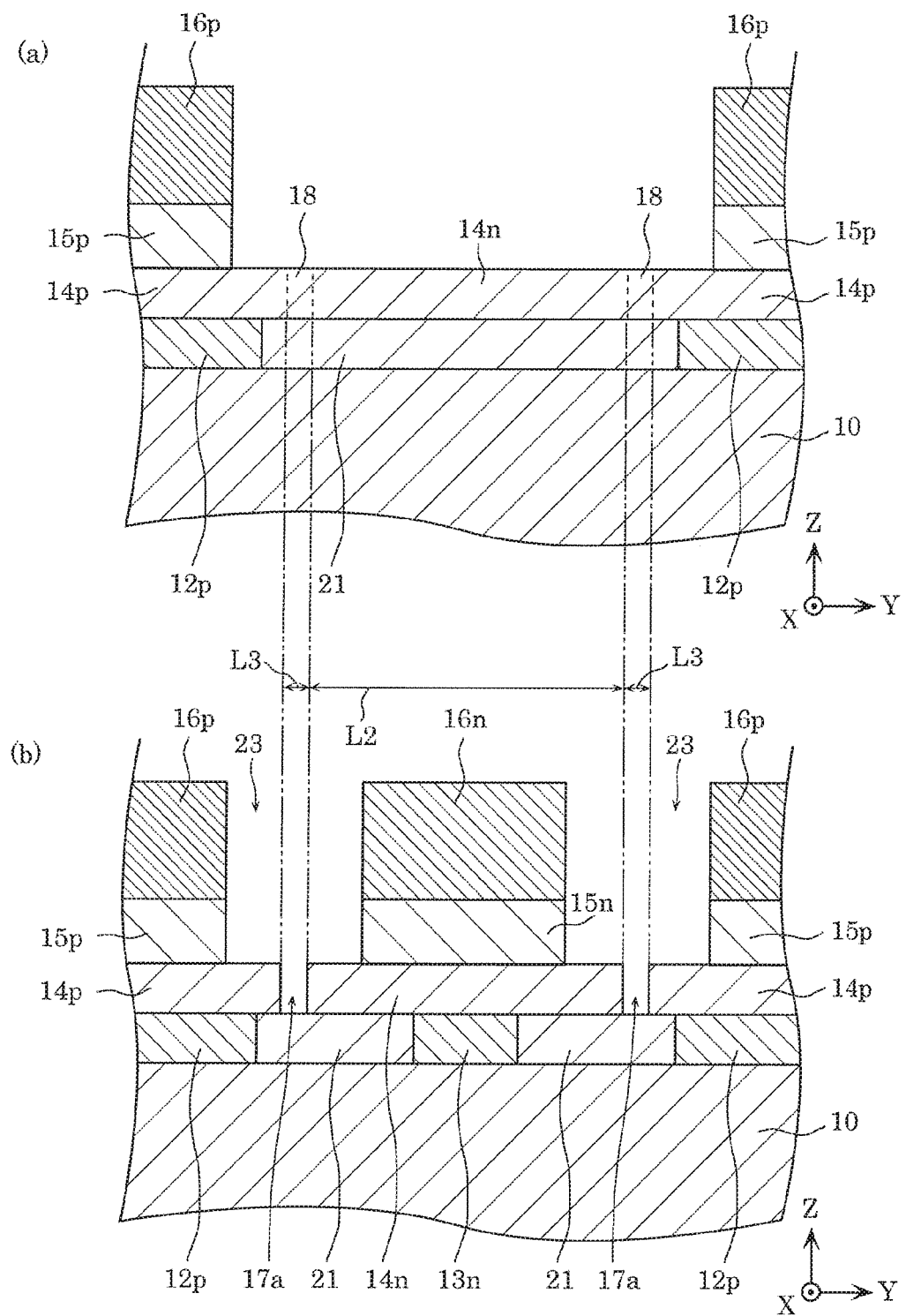
FIG. 8 is a fragmentary sectional view of the solar cell according to Embodiment 1, illustrating a state held after a conductive layer removing process.

FIG. 8 is a fragmentary sectional view of solar cell 1 according to the present embodiment, illustrating a state held after the conductive layer removing process. Specifically, (a) in FIG. 8 is a fragmentary sectional view of solar cell 1 according to the present embodiment, taken along the position corresponding to the VIa-VIa line indicated in FIG. 5B and illustrating a state held after the conductive layer removing process. In other words, (a) in FIG. 8 is a fragmentary sectional view of a region that is not irradiated with the laser in the laser machining process. Meanwhile, (b) in FIG. 8 is a fragmentary sectional view of solar cell 1 according to the present embodiment, taken along the position corresponding to the VIb-VIb line indicated in FIG. 5B and illustrating a state held after the conductive layer removing process. In other words, (b) in FIG. 8 is a fragmentary sectional view of a region that has been irradiated with the laser in the laser machining process.

As illustrated in (a) in FIG. 8, ground layer 14 is etched in the region where resist film 22 is not irradiated with the laser. Specifically, ground layer 14 is constituted by n-side ground layer 14n, p-side ground layer 14p, and first bridge portion 18. First bridge portion 18 is disposed between n-side ground layer 14n and p-side ground layer 14p and connects n-side ground layer 14n and p-side ground layer 14p.

First bridge portion 18 is formed at this position as the laser is stopped at the position where scanning path R1 intersects with scanning path R2 or R3 in the laser machining process. It is to be noted that the stated position is included in a region that is not included in irradiation ranges E1 to E3 and that lies between irradiation range E1 and irradiation range E2 or E3, for example.

As illustrated in (b) in FIG. 8, ground layer 14 is etched and separated by first separating portion 17a in the region where resist film 22 has been irradiated with the laser.

As illustrated in (a) and (b) in FIG. 8, width L3 (the length in the Y-axis direction) of first bridge portion 18 is substantially equal to the width of first separating portion 17a. Width L3 of first bridge portion 18 is smaller than the width of second separating groove 23. For example, the width of second separating groove 23 is 100 μm to 200 μm, and width L3 of first bridge portion 18 is 30 μm. Width L3 of first bridge portion 18 may be substantially equal to the diameter of a laser dot.

Thus, solar cell 1 illustrated in (a) and (b) in FIG. 1 is obtained.

It is to be noted that the method for manufacturing solar cell 1 is not limited to the method described above. For example, the order of the processes illustrated in FIG. 3 may be changed. For example, the resist removing process, the conductive layer removing process, and the ground layer removing process may be performed in this order after the electrode forming process. In the resist removing process, resist film 22 in which groove 22a illustrated in FIG. 6B has not been formed (i.e., resist film 22 that is in the state held when resist film 22 has been formed in the resist applying process) is removed. In the conductive layer removing process, conductive layer 15 is removed with n-side electrode 16n and p-side electrode 16p serving as a mask. This allows n-side conductive layer 15n and p-side conductive layer 15p to be formed. In the ground layer removing process, exposed ground layer 14 is subjected to laser machining, and first separating groove 17 is formed. In other words, n-side ground layer 14n, p-side ground layer 14p, and first bridge portion 18 are formed through laser machining. In this case as well, the start and the stop of the output of the laser are so controlled as to keep any one position from being irradiated with the laser twice, as illustrated in FIG. 5B. This makes it possible to obtain solar cell 1 illustrated in (a) and (b) in FIG. 1.

[3. Advantageous Effects and Others]

As described above, solar cell 1 according to the present embodiment is a back-junction solar cell and includes semiconductor substrate 10, n-type semiconductor layer 13n, p-type semiconductor layer 12p, and ground layer 14. Semiconductor substrate 10 has light-receiving surface 10a on which light is incident and back surface 10b that is opposite to light-receiving surface 10a. N-type semiconductor layer 13n and p-type semiconductor layer 12p are provided on back surface 10b of semiconductor substrate 10. N-type semiconductor layer 13n and p-type semiconductor layer 12p extend in a first direction and are adjacent to each other in a second direction intersecting with the first direction. Ground layer 14 is provided on n-type semiconductor layer 13n and p-type semiconductor layer 12p. Ground layer 14 includes n-side ground layer 14n provided on n-type semiconductor layer 13n, p-side ground layer 14p provided on p-type semiconductor layer 12p, and first bridge portion 18. N-side ground layer 14n and p-side ground layer 14p are separated from each other by first separating groove 17 having first separating portion 17a and second separating portion 17b that extend in different directions. First bridge portion 18 separates first separating portion 17a and second separating portion 17b. N-side ground layer 14n includes first n-side ground portion 141n that extends in the first direction. P-side ground layer 14p includes first p-side ground portion 141p that extends in the first direction and is provided adjacent to first n-side ground portion 141n. First bridge portion 18 separates first separating portion 17a and second separating portion 17b at at least one of a border between p-side ground layer 14p and a first end portion of first n-side ground portion 141n on one side in the first direction or a border between n-side ground layer 14n and a second end portion of first p-side ground portion 141p on another side in the first direction.

With this configuration, the output of the laser can be stopped at a position corresponding to first bridge portion 18 in the laser machining for separating ground layer 14 into n-side ground layer 14n and p-side ground layer 14p. In other words, the above configuration makes it possible to keep first separating portion 17a and second separating portion 17b from intersecting with each other. Accordingly, it is possible to keep any one position from being irradiated with the laser twice, and thus solar cell 1 with less damage on a semiconductor layer and so on can be achieved when laser machining is employed.

N-side ground layer 14n further includes second n-side ground portion 142n that extends in the second direction and connects to an end portion of first n-side ground portion 141n on the other side in the first direction, and p-side ground layer 14p further includes second p-side ground portion 142p that extends in the second direction and connects to an end portion of first p-side ground portion 141p on the one side in the first direction. First separating portion 17a extends in the first direction as viewed in a plan view of solar cell 1 and is provided between first n-side ground portion 141n and first p-side ground portion 141p that are adjacent to each other. Second separating portion 17b includes second separating portion 17b provided between the first end portion and second p-side ground portion 142p and second separating portion provided between the second end portion and second n-side ground portion 142n, and second separating portion 17b has a length in the second direction that is greater than gap L2 of first separating portions 17a that are adjacent to each other. First bridge portion 18 separates second separating portion 17b and an end portion of first separating portion 17a in the first direction.

This configuration makes it possible to keep any one position from being irradiated with the laser twice even in a case where first separating groove 17 is formed through a plurality of instances of laser irradiation. Thus, solar cell 1 with less damage on a semiconductor layer and so on can be achieved when laser machining is employed.

First bridge portion 18 has length L1 that is no greater than the length (width L3 in the present embodiment) of first bridge portion 18 in the Y-axis direction.

This configuration makes it possible to increase the resistance of first bridge portion 18. Thus, any influence on carrier collection by first bridge portion 18 can be suppressed, and solar cell 1 with less damage on a semiconductor layer and so on can be achieved when laser machining is employed.

As described above, the method for manufacturing a solar cell according to the present embodiment is a method for manufacturing a back-junction solar cell. The method includes: a semiconductor layer forming process (S10) of forming n-type semiconductor layer 13n and p-type semiconductor layer 12p on back surface 10b of semiconductor substrate 10 having light-receiving surface 10a on which light is incident and back surface 10b opposite to light-receiving surface 10a, n-type semiconductor layer 13n and p-type semiconductor layer 12p extending in a first direction and being adjacent to each other in a second direction intersecting with the first direction; a ground layer forming process (S11) of forming ground layer 14 on back surface 10b on which n-type semiconductor layer 13n and p-type semiconductor layer 12p are formed; a conductive layer forming process (S12) of forming conductive layer 15 on ground layer 14; a resist forming process (S13) of applying a resist on conductive layer 15 in a region corresponding to first separating groove 17 that separates ground layer 14 into n-side ground layer 14n and p-side ground layer 14p; an electrode forming process (S14) of forming n-side electrode 16n and p-side electrode 16p through electrolytic plating with conductive layer 15 on which resist film 22 has been formed in the resist forming process serving as a seed layer; a laser machining process (S15) of scanning a laser to form groove 22a in resist film 22 so as to penetrate therethrough to reach conductive layer 15 after the electrode forming process; a ground layer removing process (S16) of forming first separating groove 17 that separates ground layer 14 into n-side ground layer 14n and p-side ground layer 14p by etching back surface 10b on which groove 22a has been formed; and a resist removing process (S17) of removing resist film 22 after the ground layer removing process. In the laser machining process, the output of the laser is stopped at a position where scanning paths R1 to R3 through which the laser is scanned intersect, and thus first separating groove 17 in which first separating portion 17a and second separating portion 17b that extend in difference directions are separated is formed at the stated position.

With this method, as the output of the laser is stopped at the position where scanning paths R1 to R3 intersect, solar cell 1 in which first separating portion 17a and second separating portion 17b are separated by first bridge portion 18 can be achieved.

In addition, in the laser machining process, resist film 22 is removed by the laser, and this can keep removed conductive layer 15 and ground layer 14 from adhering to their surroundings, as compared to a case where conductive layer 15 and ground layer 14 are directly removed by the laser.

Variation 1 of Embodiment 1

Now, with reference to FIGS. 9 and 10, a solar cell according to the present variation will be described.

Figure 9:
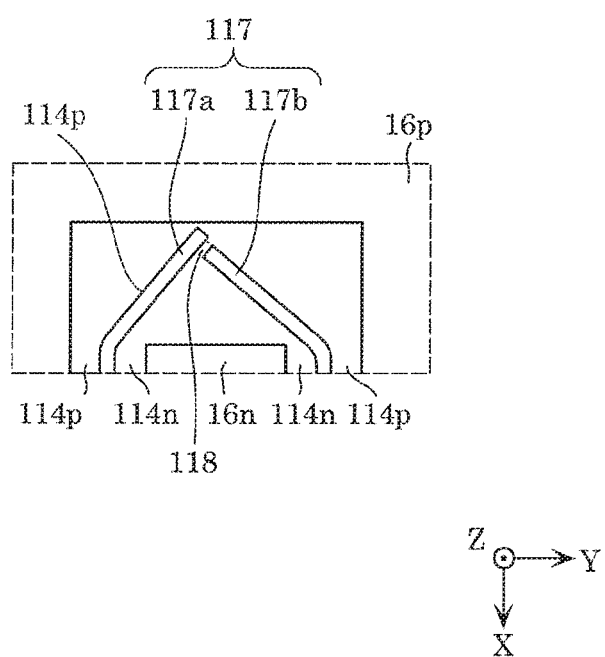
FIG. 9 is a plan view illustrating a solar cell according to Variation 1 of Embodiment 1.

FIG. 9 is a plan view illustrating the solar cell according to the present variation. Specifically, FIG. 9 illustrates a region of the solar cell that corresponds to the region illustrated in (b) in FIG. 1.

As illustrated in FIG. 9, in the present embodiment, a ground layer includes n-side ground layer 114n, p-side ground layer 114p, and first bridge portion 118.

The ground layer is separated by first separating groove 117. Specifically, the ground layer is separated into n-side ground layer 114n and p-side ground layer 114p by first separating portion 117a and second separating portion 117b.

As viewed in a plan view of the solar cell, first separating portion 117a is provided such that its one end portion lies at a border between first p-side ground portion 141p and second n-side ground portion 142n (see (a) in FIG. 1) and another end portion lies at a border between second p-side ground portion 142p and one of first n-side ground portions 141n adjacent to first p-side ground portion 141p.

As viewed in a plan view of the solar cell, second separating portion 117b is provided such that its one end portion lies at a border between first p-side ground portion 141p and second n-side ground portion 142n and another end portion lies at a border between second p-side ground portion 142p and another one of first n-side ground portions 141n adjacent to first p-side ground portion 141p.

First separating portion 117a and second separating portion 117b each have a shape that is curved at its end portion side, for example.

First bridge portion 118 is disposed between an end portion of first separating portion 117a and an end portion of second separating portion 117b that are adjacent to each other. In other words, first bridge portion 118 separates first separating portion 117a and second separating portion 117b that extend in different directions at a border between n-side ground layer 114n and p-side ground layer 114p.

Next, with reference to FIG. 10, a method for manufacturing the solar cell according to the present variation will be described. One feature of the present variation lies in the laser machining process illustrated in FIG. 3, and only the laser machining process will be described. Other processes are similar to those in Embodiment 1.

Figure 10:
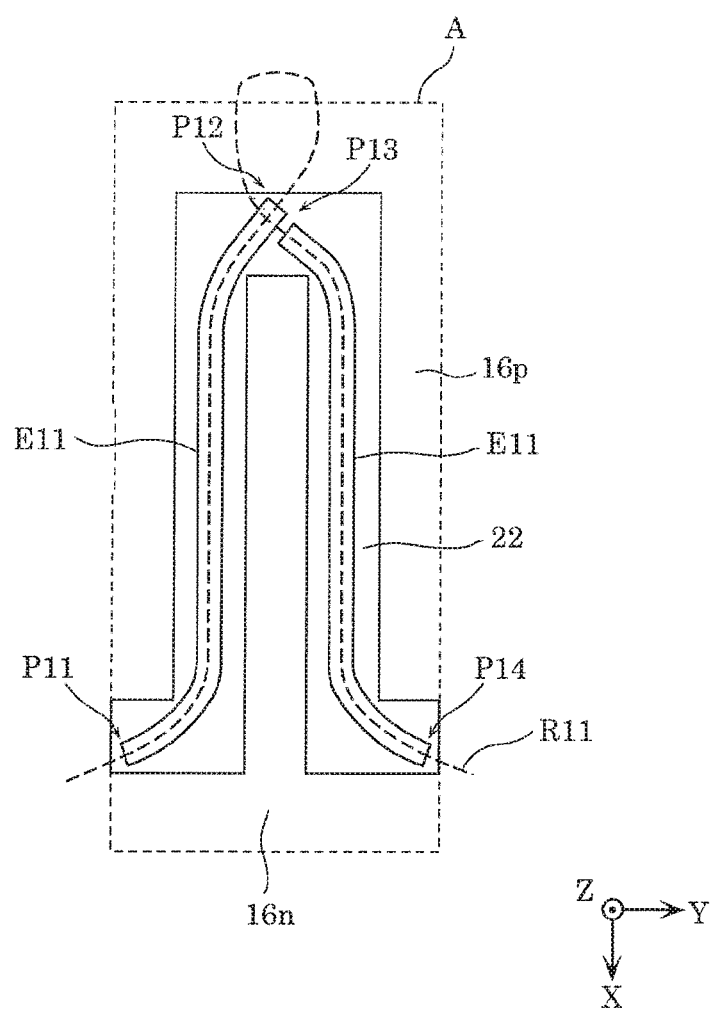
FIG. 10 is a plan view illustrating a scanning path of a laser in a laser machining process according to Variation 1 of Embodiment 1.

FIG. 10 is a plan view illustrating a scanning path of a laser in the laser machining process according to the present variation. Specifically, FIG. 10 illustrates a region corresponding to dash-enclosed region A indicated in (a) in FIG. 1.

As illustrated in FIG. 10, the laser is scanned along scanning path R11. Specifically, in the scan along scanning path R11, resist film 22 in the range of irradiation range E11 is irradiated with the laser. In other words, in the present variation, a groove can be formed in resist film 22 with a single scan.

Irradiation range E11 represents a range along scanning path R11 that has been irradiated with the laser. Scanning path R11 has a shape that is at least partially curved. In other words, scanning path R11 has a curved path in a region between n-side electrode 16n and p-side electrode 16p.

In scanning path R11, the laser is turned on at position P11 where the scan is curved. Then, the laser irradiation continues up to position P12. In other words, the output of the laser is turned off before the laser passes through a position where scanning path R11 intersects with itself. Then, scanning path R11 is scanned with the output of the laser being stopped, and the output of the laser is turned on at position P13 that is past the position where scanning path R11 intersects with itself. In other words, no laser irradiation is performed at the position where scanning path R11 intersects with itself. That is, no one position is irradiated with the laser twice. Then, the laser irradiation continues up to position P14, and the output of the laser is stopped at position P14.

As the output of the laser is stopped at a position where scanning path R11 scanned by the laser intersects with itself in the laser machining process, first separating groove 117 in which first separating portion 117a and second separating portion 117b that extend in different directions are separated by first bridge portion 118 can be formed at the stated position. This makes it possible to obtain solar cell 1 illustrated in FIG. 9.

As described above, in the solar cell according to the present variation, n-side ground layer 114n includes second n-side ground portion 142n that extends in the second direction intersecting with the first direction and connects to an end portion of first n-side ground portion 141n on the other side in the first direction, and p-side ground layer 114p includes second p-side ground portion 142p that extends in the second direction and connects to an end portion of first p-side ground portion 141p on the one side in the first direction. As viewed in a plan view of the solar cell, first separating portion 117a is provided such that one end portion lies at a border between first p-side ground portion 141p and second n-side ground portion 142n and another end portion lies at a border between second p-side ground portion 142p and one of first n-side ground portions 141n adjacent to first p-side ground portion 141p. In addition, as viewed in a plan view of the solar cell, second separating portion 117b is provided such that one end portion lies at a border between first p-side ground portion 141p and second n-side ground portion 142n and another end portion lies at a border between second p-side ground portion 142p and another one of first n-side ground portions 141n adjacent to first p-side ground portion 141p. First bridge portion 118 separates an end portion of first separating portion 117a and an end portion of second separating portion 117b that are adjacent to each other.

This configuration makes it possible to keep any position where scanning path R11 intersects with itself from being irradiated with the laser twice even in a case where first separating groove 117 is formed with a single laser scan. Thus, a solar cell with less damage on a semiconductor layer and so on can be achieved when laser machining is employed.

Variation 2 of Embodiment 1

Now, with reference to FIGS. 11 to 13, a solar cell according to the present variation will be described. One feature of the present variation lies in an irradiation range irradiated with a laser in the laser machining process. In other words, the present variation differs from Embodiment 1 in the positions where a first separating portion and a second separating portion are formed.

Figure 11:
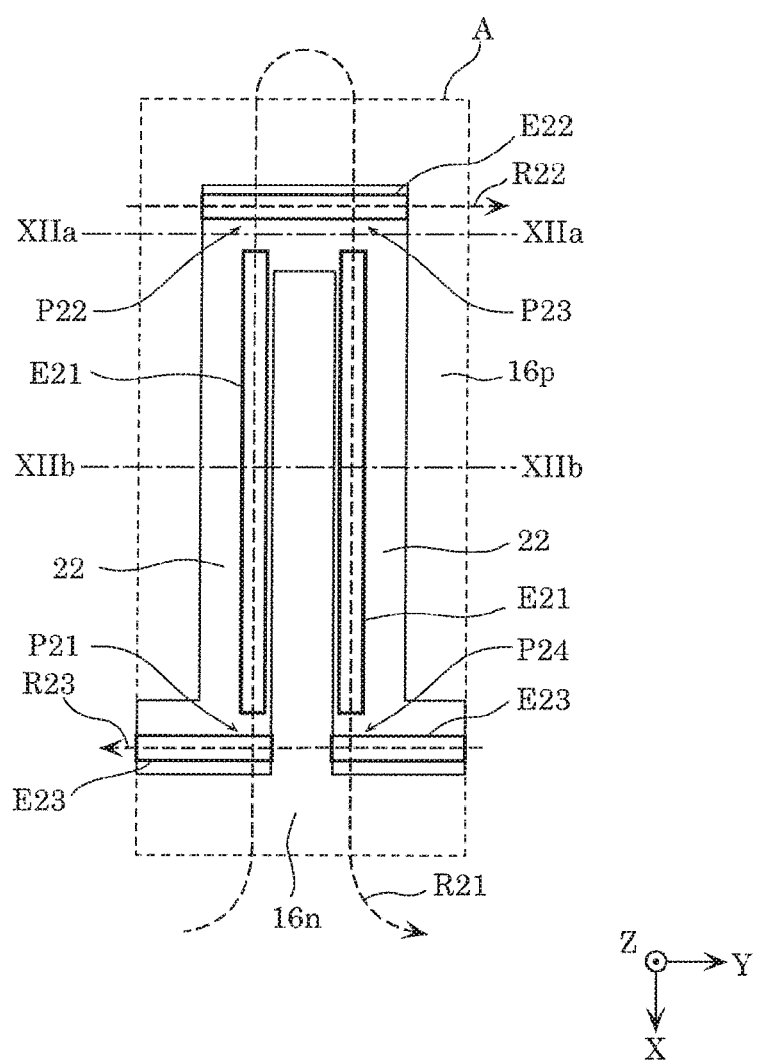
FIG. 11 is a plan view illustrating a scanning path of a laser in a laser machining process according to Variation 2 of Embodiment 1.

FIG. 11 is a plan view illustrating a scanning path of a laser in the laser machining process according to the present variation.

In FIG. 5B, resist film 22 is irradiated with the laser along a substantially center section between n-side electrode 16n and p-side electrode 16p. In the present variation, however, as illustrated in FIG. 11, resist film 22 is irradiated with the laser along a position that lies between n-side electrode 16n and p-side electrode 16p and is closer to one of n-side electrode 16n or p-side electrode 16p.

In FIG. 11, resist film 22 is irradiated with the laser along scanning paths R21 to R23, and scanning path R21 runs along a position that lies between n-side electrode 16n and p-side electrode 16p and is closer to n-side electrode 16n of n-side electrode 16n and p-side electrode 16p. Therefore, irradiation range E21 is formed along a position that lies between n-side electrode 16n and p-side electrode 16p and is closer to n-side electrode 16n of n-side electrode 16n and p-side electrode 16p. For example, irradiation range E21 is formed along a position that lies between n-side finger electrode 161n and p-side finger electrode 161p (see (a) in FIG. 1) and is closer to n-side finger electrode 161n.

Meanwhile, scanning path R22 runs along a position that lies between n-side electrode 16n and p-side electrode 16p and is closer to p-side electrode 16p. Therefore, irradiation range E22 is formed along a position that lies between n-side electrode 16n and p-side electrode 16p and is closer to p-side electrode 16p. For example, irradiation range E22 is formed along a position that lies between n-side finger electrode 161n and p-side busbar electrode 162p (see (a) in FIG. 1) and is closer to p-side busbar electrode 162p.

Meanwhile, scanning path R23 runs along a position that lies between n-side electrode 16n and p-side electrode 16p and is closer to n-side electrode 16n. Therefore, irradiation range E23 is formed along a position that lies between n-side electrode 16n and p-side electrode 16p and is closer to n-side electrode 16n. For example, irradiation range E23 is formed along a position that lies between p-side finger electrode 161p and n-side busbar electrode 162n (see (a) in FIG. 1) and is closer to n-side busbar electrode 162n.

Positions P21 to P24 correspond to respective positions P1 to P4 indicated in FIG. 5B. Specifically, the laser irradiation is started at positions P21 and P23 and stopped at positions P22 and P24. In other words, irradiation range E21 is formed between irradiation ranges E22 and E23.

Figure 12A:
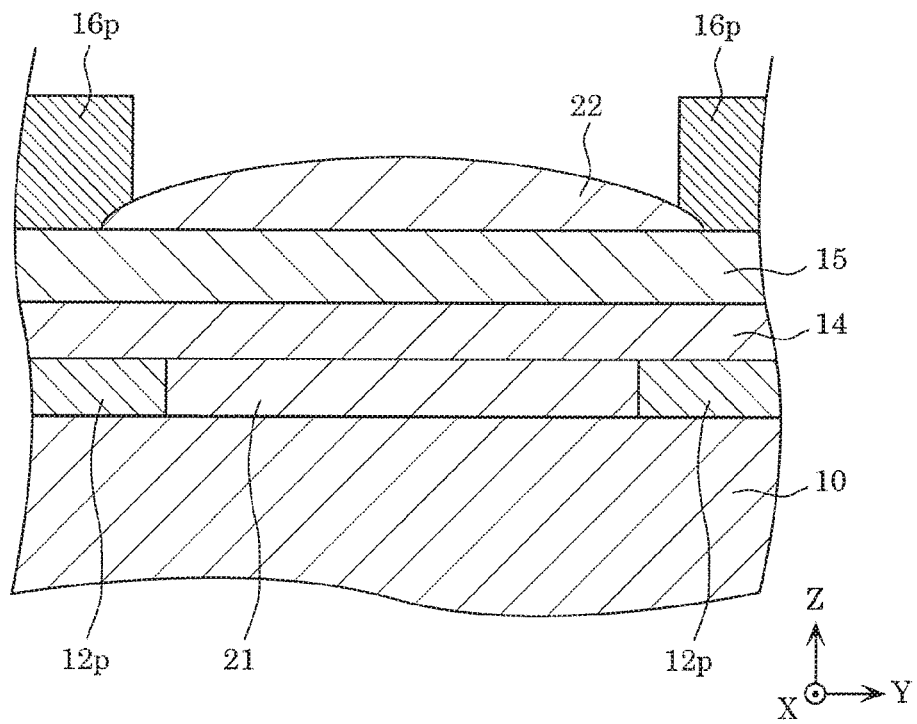
FIG. 12A is a fragmentary sectional view of a solar cell according to Variation 2 of Embodiment 1, taken along the XIIa-XIIa line indicated in FIG. 11 and illustrating a state held after the laser machining process.
Figure 12B:
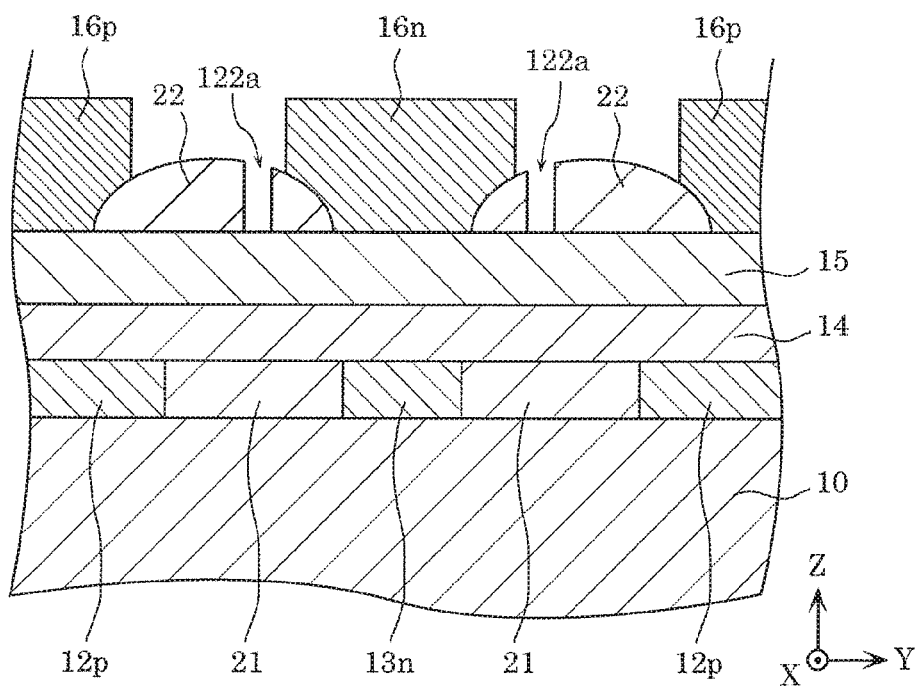
FIG. 12B is a fragmentary sectional view of the solar cell according to Variation 2 of Embodiment 1, taken along the XIIb-XIIb line indicated in FIG. 11 and illustrating a state held after the laser machining process.

FIG. 12A is a fragmentary sectional view of the solar cell according to the present variation, taken along the XIIa-XIIa line indicated in FIG. 11 and illustrating a state held after the laser machining process. FIG. 12B is a fragmentary sectional view of the solar cell according to the present variation, taken along the XIIb-XIIb line indicated in FIG. 11 and illustrating a state held after the laser machining process.

As illustrated in FIG. 12A, no groove is formed in resist film 22 in the region where resist film 22 is not irradiated with the laser. In other words, resist film 22 remains in the state held when resist film 22 has been formed in step S13 indicated in FIG. 3.

As illustrated in FIG. 12B, groove 122a that penetrates through resist film 22 to reach conductive layer 15 is formed in the region where resist film 22 has been irradiated with the laser. In FIG. 12B, grooves 122a corresponding to irradiation ranges E21 are formed. Specifically, as viewed in a sectional view of the solar cell, groove 122a is formed at a position between a position where the thickness of resist film 22 is at a maximum and n-side electrode 16n or p-side electrode 16p. In the present embodiment, resist film 22 is formed into a semicylindrical shape. The position where the thickness of resist film 22 is at a maximum is substantially the center portion of resist film 22 along its width (the length in the Y-axis direction). For example, the position where the thickness of resist film 22 is at a maximum lies at substantially the center between n-side electrode 16n and p-side electrode 16p. Therefore, groove 122a is formed at a position that is closer to one of n-side electrode 16n or p-side electrode 16p, as viewed in a sectional view of the solar cell. In the present embodiment, groove 122a is formed at a position closer to n-side electrode 16n.

Figure 13:
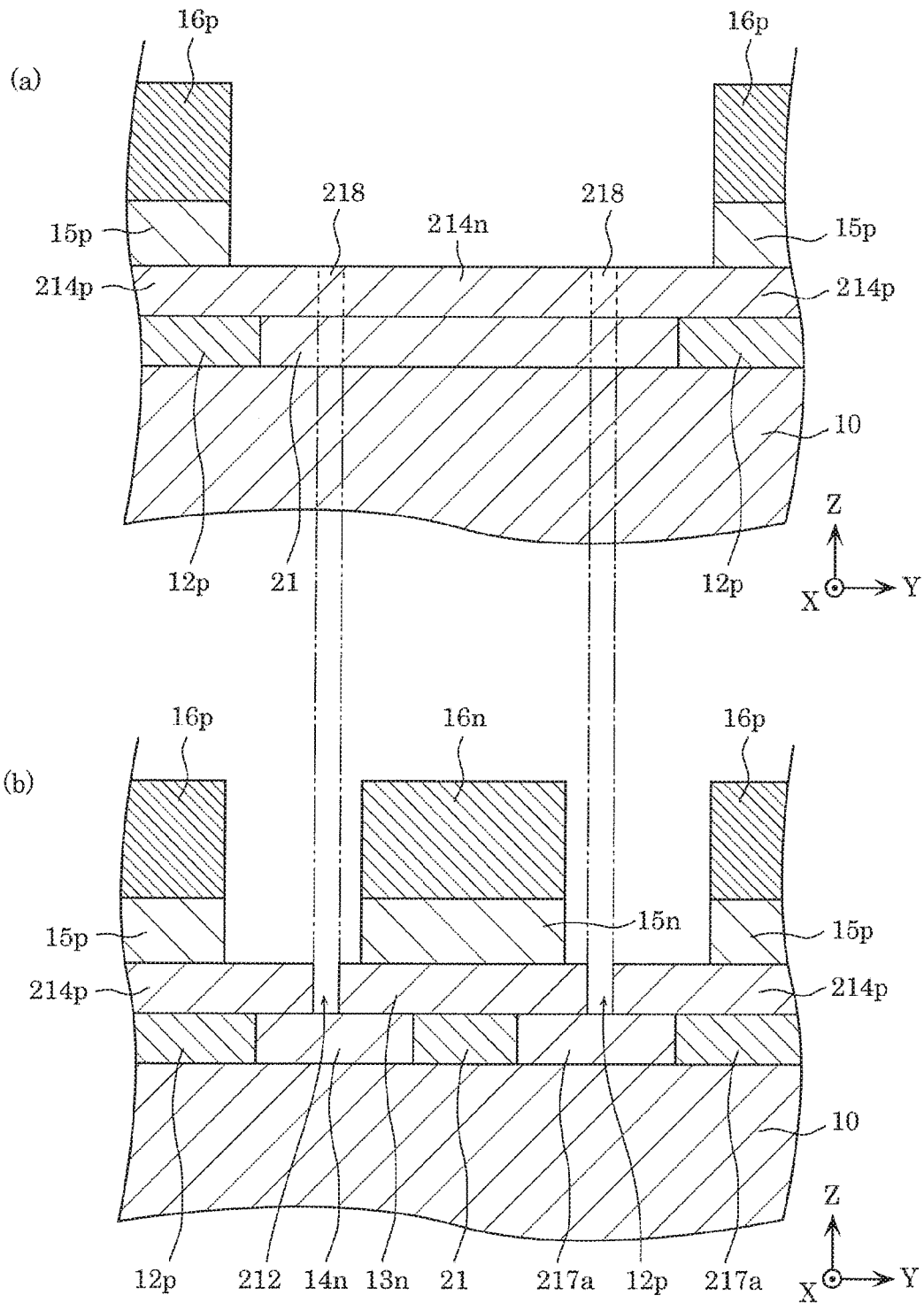
FIG. 13 is a fragmentary sectional view of the solar cell according to Variation 2 of Embodiment 1, illustrating a state held after a conductive layer removing process.

FIG. 13 is a fragmentary sectional view of the solar cell according to the present variation, illustrating a state held after the ground layer removing process. Specifically, (a) in FIG. 13 is a fragmentary sectional view of the solar cell according to the present variation, taken along the XIIa-XIIa line indicated in FIG. 11 and illustrating a state held after the ground layer removing process. Meanwhile, (b) in FIG. 13 is a fragmentary sectional view of the solar cell according to the present variation, taken along the XIIb-XIIb line indicated in FIG. 11 and illustrating a state held after the ground layer removing process.

As illustrated in (a) in FIG. 13, ground layer 14 is not etched in the region where resist film 22 is not irradiated with the laser. Specifically, ground layer 14 is constituted by n-side ground layer 214n, p-side ground layer 214p, and first bridge portion 218. First bridge portion 218 is disposed between n-side ground layer 214n and p-side ground layer 214p and connects n-side ground layer 214n and p-side ground layer 214p.

As illustrated in (b) in FIG. 13, ground layer 14 is etched and separated by first separating portion 217a in the region where resist film 22 has been irradiated with the laser.

As illustrated in (a) and (b) in FIG. 13, first bridge portion 218 and first separating portion 217a are formed closer to p-side electrode 16p of n-side electrode 16n and p-side electrode 16p, as viewed in a sectional view of the solar cell.

In addition, although not illustrated, a second separating portion formed by irradiation range E22 is formed closer to p-side electrode 16p, as viewed in a sectional view of the solar cell. Furthermore, a second separating portion formed by irradiation range E23 is formed closer to n-side electrode 16n, as viewed in a sectional view of the solar cell. First separating portion 217a and the second separating portions form a separating groove.

As described above, the solar cell according to the present variation includes n-side electrode 16n that is provided on n-side conductive layer 15n and formed by a plating film and p-side electrode 16p that is provided on p-side conductive layer 15p and formed by a plating film. The first separating groove (e.g., first separating portion 217a) is disposed at a position that lies between n-side electrode 16n and p-side electrode 16p and is closer to one of n-side electrode 16n and p-side electrode 16p, as viewed in a plan view of the solar cell.

This configuration allows for laser machining of a portion different from a portion where the thickness of resist film 22 is at a maximum when resist film 22 is thick, and thus groove 122a can be formed without increasing the output of the laser. In other words, even in a case where resist film 22 is thick, damage, which could increase with an increase in the output of the laser, can be suppressed. Accordingly, the present variation can achieve a solar cell with less damage on a semiconductor layer and so on when laser machining is employed.

In addition, as described above, in the method for manufacturing the solar cell according to the present variation, the laser is scanned through a portion between the position where the thickness of resist film 22 is at a maximum and n-side electrode 16n or p-side electrode 16p in the laser machining process, as viewed in a sectional view of the solar cell. For example, the laser may be scanned through a position that is closer to one of n-side electrode 16n or p-side electrode 16p in the laser machining process, as viewed in a sectional view of the solar cell.

This configuration allows for laser machining of a portion different from a portion where the thickness of resist film 22 is at a maximum when resist film 22 is thick, and thus groove 122a can be formed without increasing the output of the laser. In other words, even in a case where resist film 22 is thick, damage, which could increase with an increase in the output of the laser, can be suppressed. Furthermore, since the portion where the thickness of resist film 22 is at a maximum is not subjected to laser machining, it is possible to keep resist film 22 from remaining even after the laser machining. Accordingly, when laser machining is employed, damage on a semiconductor layer and so on can be suppressed, and a solar cell with an improved yield rate can be achieved.

Variation 3 of Embodiment 1

Now, with reference to FIG. 14, a solar cell according to the present variation will be described.

Figure 14:
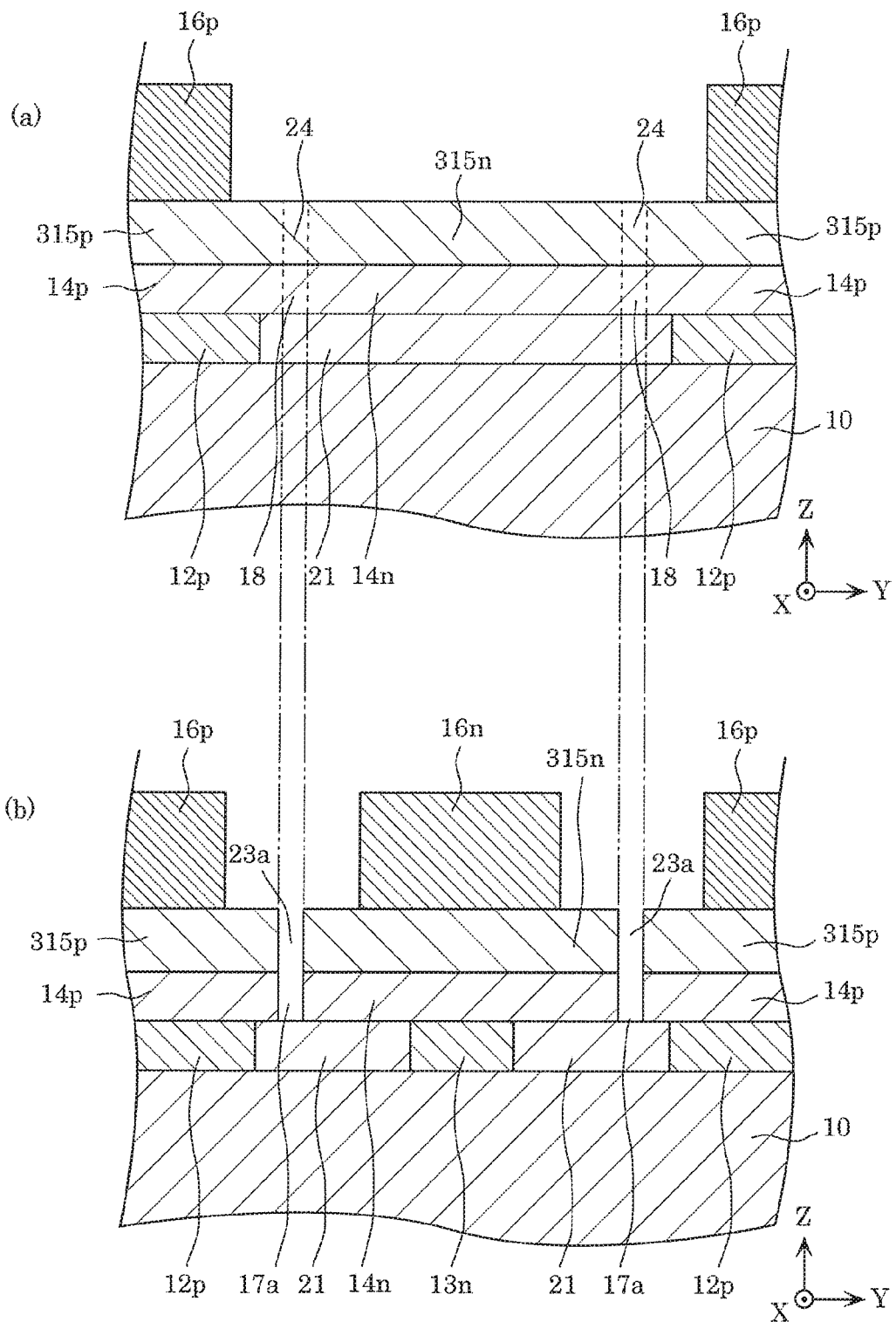
FIG. 14 is a fragmentary sectional view of a solar cell according to Variation 3 of Embodiment 1.

FIG. 14 is a fragmentary sectional view of the solar cell according to the present variation. Specifically, (a) in FIG. 14 is a fragmentary sectional view of the solar cell according to the present variation, taken along the position corresponding to the VIa-VIa line indicated in FIG. 5B. Meanwhile, (b) in FIG. 14 is a fragmentary sectional view of the solar cell according to the present variation, taken along the position corresponding to the VIb-VIb line indicated in FIG. 5B. In the present variation, the conductive layer removing process indicated in FIG. 3 is not performed.

As illustrated in (a) in FIG. 14, a conductive layer is constituted by n-side conductive layer 315n, p-side conductive layer 315p, and second bridge portion 24. Second bridge portion 24 is formed on first bridge portion 18. For example, second bridge portion 24 is formed on first bridge portion 18 illustrated in (b) in FIG. 1. The solar cell according to the present variation includes a separating groove that separates the conductive layer into n-side conductive layer 315n and p-side conductive layer 315p, and this separating groove is provided at a position corresponding to first separating portion 17a and second separating portion 17b illustrated in (b) in FIG. 1. In other words, the conductive layer includes a separating groove constituted by two separating portions extending in different directions. Second bridge portion 24 separates the two separating portions. The separating groove (e.g., first separating portion 23a illustrated in (b) in FIG. 14) that separates the conductive layer into n-side conductive layer 315n and p-side conductive layer 315p is an example of a second separating groove.

As second bridge portion 24 is disposed at the position described above, n-type semiconductor layer 13n and p-type semiconductor layer 12p are connected via second bridge portion 24. When n-type semiconductor layer 13n and p-type semiconductor layer 12p are connected via second bridge portion 24 with a resistance that is high but does not affect the photoelectric conversion efficiency, the presence of second bridge portion 24 has little influence on the photoelectric conversion efficiency. The resistance of second bridge portion 24 is equivalent to the resistance of first bridge portion 18, for example. The resistance of second bridge portion 24 is no lower than 1 kΩ/□, for example. The sheet resistance of the conductive layer (in the present embodiment, second bridge portion 24, n-side conductive layer 315n, and p-side conductive layer 315p) is no lower than 1 kΩ/□, for example. The size of second bridge portion 24 as viewed in a plan view is substantially equal to the size of first bridge portion 18, for example. Therefore, the resistance of second bridge portion 24 is high, and this makes it possible to keep n-side conductive layer 315n and p-side conductive layer 315p from becoming electrically continuous with each other.

After the resist removing process, a treatment for increasing the resistance value of second bridge portion 24 may be performed. For example, a treatment such as a heat treatment may be performed under an oxygen atmosphere to increase the resistance.

As illustrated in (b) in FIG. 14, the conductive layer is separated into n-side conductive layer 315n and p-side conductive layer 315p by first separating portion 23a. The width (the length in the Y-axis direction) of first separating portion 23a is substantially equal to the width of first separating portion 17a, for example.

As described above, the solar cell according to the present variation includes conductive layer 15 provided on n-side ground layer 14n and p-side ground layer 14p. Conductive layer 15 includes n-side conductive layer 315n provided on n-side ground layer 14n and p-side conductive layer 315p provided on p-side ground layer 14p that are separated from each other by the second separating groove (e.g., first separating portion 23a) as well as second bridge portion 24 that is provided on first bridge portion 18 and separates the second separating groove.

With this configuration, even if the conductive layer removing process indicated in FIG. 3 is omitted, a solar cell with less damage on a semiconductor layer and so on can be achieved when laser machining is employed.

Variation 4 of Embodiment 1

Now, with reference to FIGS. 15 and 16, a solar cell according to the present variation will be described.

Figure 15:
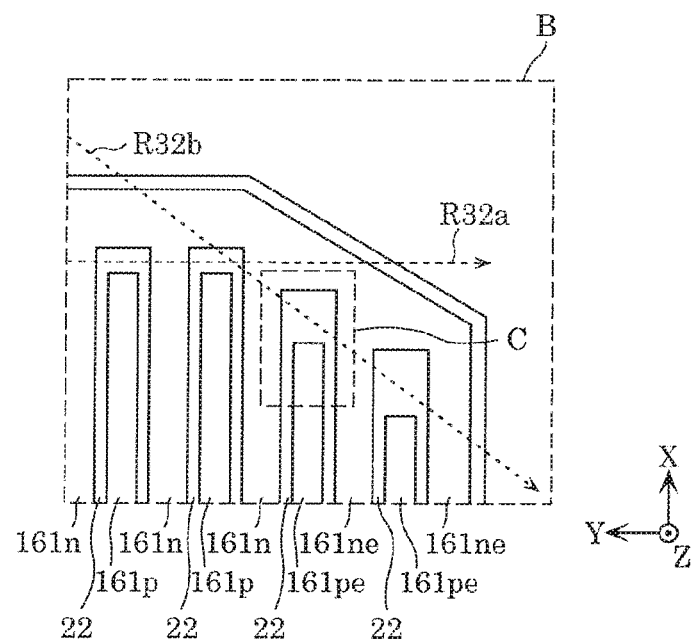
FIG. 15 is a plan view illustrating a scanning path of a laser in the vicinity of a short side of the solar cell according to Embodiment 1.
Figure 16:
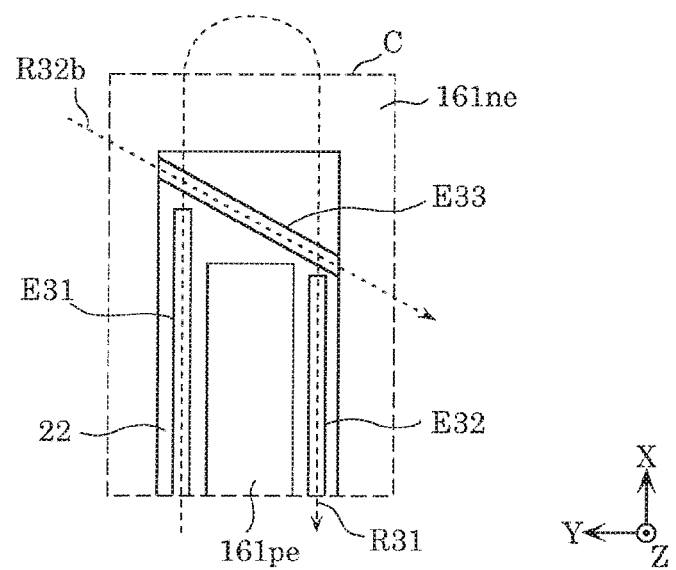
FIG. 16 is an enlarged view of region C indicated in FIG. 15.

FIG. 15 is an enlarged view of the vicinity of a short side of the solar cell according to the present variation. Specifically, region B illustrated in FIG. 15 is an enlarged view of region B indicated in FIG. 1. In FIG. 15, region B is rotated 180 degrees relative to that indicated in FIG. 1 to facilitate understanding of the drawing. In FIG. 15, R32a and R32b denote scanning paths of a laser. FIG. 16 is an enlarged view of region C indicated in FIG. 15 and illustrates a scanning path of the laser in region C and laser irradiation ranges E31, E32, and E33.

In the present variation, a scanning path of the laser in the vicinity of a short side (in the vicinity of a corner) of the solar cell will be described. In a case where the shape of the solar cell is substantially octagonal with long sides and short sides, as in the present variation, for example, the X-coordinate of a leading end of finger electrode 161pe provided at each end of the solar cell in the Y-axis direction is different from the X-coordinate of a leading end of finger electrode 161p provided in a center portion in the Y-axis direction. In other words, the X-coordinate of the leading end of finger electrode 161pe is smaller than the X-coordinate of the leading end of finger electrode 161p. In this case, the laser scan can be simplified if the laser scan at the leading end portions of a plurality of finger electrodes 161pe (two finger electrodes 161pe in the example illustrated in FIG. 15) is performed at once, as in R32b indicated in FIG. 15. For example, in a case where the laser scan is performed only along a scanning path extending in a direction substantially parallel to the Y-axis (e.g., scanning path R32a), the leading end portions of finger electrodes 161p are irradiated with the laser along scanning path R32a, and the leading end portions of two finger electrodes 161pe are each irradiated separately with the laser along respective scanning paths extending in the direction parallel to the Y-axis. In other words, the laser needs to be scanned three times. In contrast, in the present variation, the desired region can be irradiated with the laser in two laser scans along scanning paths R32a and R32b. Each end stated above in the present variation refers to a region covering several millimeters to several centimeters from the outer peripheral portion of the solar cell toward the center portion of the solar cell. In addition, scanning path R32b extends in a direction intersecting with both the X-axis and the Y-axis and is determined, as appropriate, by the X-coordinate and so on of the leading end of each finger electrode 161pe.

It is preferable that scanning path R32 of the laser intersect with finger electrode 161n on an outer peripheral side of scanning path R31. To this end, it is preferable that resist film 22 in the vicinity of the leading end of finger electrode 161pe be wider in the X-axis direction than resist film 22 in the vicinity of the leading end of finger electrode 161p. As illustrated in FIG. 16, scanning path R32b of the laser runs in a direction intersecting with both the X-axis and the Y-axis on the position where resist film 22 is disposed in the vicinity of a short side of the solar cell. In other words, laser irradiation range E33 also extends in a direction intersecting with both the X-axis and the Y-axis. As resist film 22 disposed in the vicinity of the leading end of finger electrode 161pe is wider in the X-axis direction, laser irradiation range E33 can be formed without causing any damage to the leading end of finger electrode 161pe. It suffices that the width of resist film 22 in the X-axis direction be large enough to form laser irradiation range E33.

Finger electrodes 161p and 161pe have been described in the present variation, and finger electrode 161n may also be processed in a similar manner. In other words, laser irradiation may be performed along a laser scanning path similar to the one described above at leading ends of finger electrodes 161ne (not illustrated) provided at respective ends of the solar cell in the Y-axis direction.

In the present variation described above, the solar cell is substantially octagonal, but the mode of the solar cell is not limited thereto. In addition, in the present variation described above, finger electrodes 161p and finger electrodes 161pe provided at the respective ends of the solar cell in the Y-axis direction are distinguished from each other. However, such a configuration of the electrodes does not necessarily need to be provided at the respective ends of the solar cell. In a case where the pattern in which the electrodes are disposed is modified in order to simplify the laser scan, the present variation can also be applied even if the portion where the pattern is to be modified lies at the center portion of the solar cell in the Y-axis direction. In addition, it is needless to say that the present variation can be applied not only to a back-junction solar cell but also to a double-sided light-receiving solar cell as long as a similar manufacturing process is employed.

Other Embodiments

Thus far, the solar cell and so on according to the present invention have been described based on the embodiment and the variations, but the present invention is not limited to the embodiment and the variations described above.

For example, in the embodiment and the variations described above, i-type semiconductor layer 13i and n-type semiconductor layer 13n are laminated after i-type semiconductor layer 12i and p-type semiconductor layer 12p have been laminated. Alternatively, i-type semiconductor layer 13i and n-type semiconductor layer 13n may be laminated first.

The order of the processes in the method for manufacturing the solar cell described in the embodiment and the variations above is merely an example, and this is not a limiting example. One or more of the processes may be omitted.

The processes in the method for manufacturing the solar cell described in the embodiment and the variations above may be performed in a single process or in separate processes. That the processes are performed in a single process encompasses a case where the processes are performed with the use of a single machine, a case where the processes are performed successively, or a case where the processes are performed at the same location. That the processes are performed in separate processes encompasses a case where the processes are performed with the use of separate machines, a case where the processes are performed at different times (e.g., on different days), or a case where the processes are performed at different locations.

Aside from the above, an embodiment obtained by making various modifications that a person skilled in the art can conceive of to the foregoing embodiment and variations and an embodiment achieved by combining, as desired, the constituent elements and the functions in the foregoing embodiment and variations within the scope that does not depart from the spirit of the present invention are also encompassed by the present invention.

REFERENCE MARKS IN THE DRAWINGS 1 solar cell
10 semiconductor substrate
10a light-receiving surface
10b back surface
12p p-type semiconductor layer
13n n-type semiconductor layer
14 ground layer
14n, 214n n-side ground layer
14p p-side ground layer
15 conductive layer
15n, 315n n-side conductive layer
15p, 315p p-side conductive layer
16n n-side electrode
16p p-side electrode
17, 117 first separating groove
17a, 117a, 217a first separating portion
17b, 117b second separating portion
18, 118, 218 first bridge portion
22 resist film
22a, 122a groove
23 second separating groove
23a first separating portion
24 second bridge portion
141n first n-side ground portion
141p first p-side ground portion
142n second n-side ground portion
142p second p-side ground portion
L1 length
L3 width
R1 to R3, R11, R21 to R23, R31, R32a, R32b scanning path

The invention claimed is:

1. A back-junction solar cell, comprising:
a semiconductor substrate having a light-receiving surface on which light is incident and a back surface that is opposite to the light-receiving surface;
an n-type semiconductor layer and a p-type semiconductor layer provided on the back surface of the semiconductor substrate, the n-type semiconductor layer and the p-type semiconductor layer extending in a first direction and being adjacent to each other in a second direction intersecting with the first direction; and
a ground layer provided on the n-type semiconductor layer and the p-type semiconductor layer, wherein
the ground layer includes:
an n-side ground layer provided on the n-type semiconductor layer and a p-side ground layer provided on the p-type semiconductor layer, the n-side ground layer and the p-side ground layer being separated from each other by a first separating groove having a first separating portion and a second separating portion that extend in different directions; and
a first bridge portion that separates the first separating portion and the second separating portion,
the n-side ground layer includes a first n-side ground portion that extends in the first direction,
the p-side ground layer includes a first p-side ground portion that extends in the first direction and is provided adjacent to the first n-side ground portion, and
the first bridge portion separates the first separating portion and the second separating portion at at least one of a border between the p-side ground layer and a first end portion of the first n-side ground portion on one side in the first direction or a border between the n-side ground layer and a second end portion of the first p-side ground portion on another side in the first direction.

2. The back-junction solar cell according to claim 1, further comprising a plurality of second separating portions, and a plurality of first bridge portions,
wherein the n-side ground layer includes a second n-side ground portion that extends in the second direction and connects to an end portion of the first n-side ground portion on the other side in the first direction,
the p-side ground layer includes a second p-side ground portion that extends in the second direction and connects to an end portion of the first p-side ground portion on the one side in the first direction,
the first separating portion extends in the first direction as viewed in a plan view of the back-junction solar cell and is provided between the first n-side ground portion and the first p-side ground portion that are adjacent to each other,
one of the plurality of second separating portions being provided between the first end portion and the second p-side ground portion and an other one of the plurality of second separating portions being provided between the second end portion and the second n-side ground portion,
the plurality of second separating portions each have a length in the second direction that is greater than a gap between first separating portions that are adjacent to each other, the first separating portions each being the first separating portion,
one of the plurality of first bridge portions separates the one of the plurality of second separating portions and an end of one of the first separating portions in the first direction, and another one of the plurality of first bridge portions separates the other one of the plurality of second separating portions and another end of the one of the first separating portions in the first direction.

3. The back-junction solar cell according to claim 2, wherein the first bridge portion has a length in the first direction that is no greater than a length of the first bridge portion in the second direction.

4. The back-junction solar cell according to claim 1, wherein
the n-side ground layer includes a second n-side ground portion that extends in the second direction intersecting with the first direction and connects to an end portion of the first n-side ground portion on the other side in the first direction,
the p-side ground layer includes a second p-side ground portion that extends in the second direction and connects to an end portion of the first p-side ground portion on the one side in the first direction,
as viewed in a plan view of the back-junction solar cell, the first separating portion is provided such that one end portion lies at a border between the first p-side ground portion and the second n-side ground portion and another end portion lies at a border between the second p-side ground portion and one of first n-side ground portions adjacent to the first p-side ground portion, the first n-side ground portions each being the first n-side ground portion,
as viewed in a plan view of the back-junction solar cell, the second separating portion is provided such that one end portion lies at a border between the first p-side ground portion and the second n-side ground portion and another end portion lies at a border between the second p-side ground portion and another one of first n-side ground portions adjacent to the first p-side ground portion, the first n-side ground portions each being the first n-side ground portion, and
the first bridge portion separates an end portion of the first separating portion and an end portion of the second separating portion that are adjacent to each other.

5. The back-junction solar cell according to claim 1, further comprising:
a conductive layer provided on the n-side ground layer and the p-side ground layer, wherein
the conductive layer includes:
an n-side conductive layer provided on the n-side ground layer and a p-side conductive layer provided on the p-side ground layer, the n-side conductive layer and the p-side conductive layer being separated from each other by a second separating groove; and
a second bridge portion that is provided on the first bridge portion and separates the second separating groove.

6. The back-junction solar cell according to claim 5, further comprising:
an n-side electrode provided on the n-side conductive layer and formed by a first plating film; and
a p-side electrode provided on the p-side conductive layer and formed by a second plating film, wherein
the first separating groove is disposed at a position that lies between the n-side electrode and the p-side electrode and is closer to one of the n-side electrode or the p-side electrode, as viewed in a plan view of the back-junction solar cell.

7. The back-junction solar cell according to claim 1, wherein the ground layer is formed of a transparent material.

8. A method for manufacturing a back-junction solar cell, the method comprising:
- (a) forming an n-type semiconductor layer and a p-type semiconductor layer on a back surface of a semiconductor substrate having a light-receiving surface on which light is incident and the back surface opposite to the light-receiving surface, the n-type semiconductor layer and the p-type semiconductor layer extending in a first direction and being adjacent to each other in a second direction intersecting with the first direction;
- (b) forming a ground layer on the back surface on which the n-type semiconductor layer and the p-type semiconductor layer are formed;
- (c) forming a conductive layer on the ground layer;
- (d) applying a resist on the conductive layer in a region corresponding to a separating groove that separates the ground layer into an n-side ground layer and a p-side ground layer;
- (e) forming an n-side electrode and a p-side electrode through electrolytic plating with the conductive layer on which a resist film is formed in (d) serving as a seed layer;
- (f) scanning a laser to form a groove in the resist film so as to penetrate therethrough to reach the seed layer after (e);
- (g) forming the separating groove by etching the back surface on which the groove is formed; and
- (h) removing the resist film after (g), wherein in (f), an output of the laser is stopped at a position where a scanning path along which the laser is scanned intersects, and thus the separating groove where a first separating portion and a second separating portion that extend in different directions are separated is formed at the position.

9. The method for manufacturing a back-junction solar cell according to claim 8, wherein in (f), the laser is scanned through a position that lies between a position where a thickness of the resist film is at a maximum and the n-side electrode or the p-side electrode, as viewed in a sectional view of the back-junction solar cell.

10. The method for manufacturing a back-junction solar cell according to claim 8, wherein in (f), the laser is scanned through a position that is closer to one of the n-side electrode or the p-side electrode, as viewed in a sectional view of the back-junction solar cell.

* * * * *